United States Patent
Wei et al.

(10) Patent No.: US 9,117,842 B2
(45) Date of Patent: Aug. 25, 2015

(54) METHODS OF FORMING CONTACTS TO SOURCE/DRAIN REGIONS OF FINFET DEVICES

(71) Applicant: GLOBALFOUNDRIES Inc., Grand Cayman (KY)

(72) Inventors: Andy C. Wei, Queensbury, NY (US); Shao Ming Koh, Singapore (SG)

(73) Assignee: GLOBALFOUNDRIES Inc., Grand Cayman (KY)

( * ) Notice: Subject to any disclaimer, the term of this patent is extended or adjusted under 35 U.S.C. 154(b) by 71 days.

(21) Appl. No.: 13/798,429

(22) Filed: Mar. 13, 2013

(65) Prior Publication Data

US 2014/0273369 A1    Sep. 18, 2014

(51) Int. Cl.
| H01L 21/00 | (2006.01) |
| H01L 29/66 | (2006.01) |
| H01L 21/8234 | (2006.01) |
| H01L 21/8238 | (2006.01) |
| H01L 21/84 | (2006.01) |

(52) U.S. Cl.
CPC .. *H01L 29/66606* (2013.01); *H01L 21/823431* (2013.01); *H01L 21/823821* (2013.01); *H01L 21/845* (2013.01); *H01L 29/66545* (2013.01)

(58) Field of Classification Search
None
See application file for complete search history.

(56) References Cited

U.S. PATENT DOCUMENTS

| 8,101,927 | B2* | 1/2012 | Carlson et al. ........... 250/492.21 |
| 8,153,466 | B2* | 4/2012 | Low et al. ................. 438/57 |
| 2006/0068531 | A1 | 3/2006 | Breitwisch et al. |
| 2007/0120154 | A1* | 5/2007 | Zhu et al. ................ 257/288 |
| 2007/0254461 | A1* | 11/2007 | Wei et al. ................ 438/514 |
| 2008/0003730 | A1* | 1/2008 | Okuno ..................... 438/156 |
| 2009/0026505 | A1 | 1/2009 | Okano |
| 2009/0101972 | A1 | 4/2009 | Gaines et al. |
| 2011/0062443 | A1* | 3/2011 | Maszara ................... 257/57 |
| 2011/0079855 | A1* | 4/2011 | Chan et al. ............... 257/368 |
| 2011/0129978 | A1 | 6/2011 | Cheng et al. |
| 2011/0151652 | A1* | 6/2011 | Sssaki et al. .............. 438/513 |
| 2012/0018730 | A1 | 1/2012 | Kanakasabapathy et al. |
| 2012/0153387 | A1 | 6/2012 | Murthy et al. |
| 2012/0256238 | A1* | 10/2012 | Ning et al. ................ 257/280 |
| 2013/0011986 | A1* | 1/2013 | Zhou et al. ................ 438/290 |
| 2013/0237026 | A1* | 9/2013 | Lee et al. ................. 438/283 |
| 2014/0001520 | A1 | 1/2014 | Glass et al. |

* cited by examiner

*Primary Examiner* — Charles Garber
*Assistant Examiner* — Evren Seven
(74) *Attorney, Agent, or Firm* — Amerson Law Firm, PLLC

(57) ABSTRACT

In one example, the method disclosed herein includes forming at least one fin for a FinFET device in a semiconducting substrate, performing at least one process operation to form a region in the at least one fin that contains a metal diffusion inhibiting material, depositing a layer of metal on the region in the at least one fin and forming a metal silicide region on the at least one fin.

24 Claims, 22 Drawing Sheets

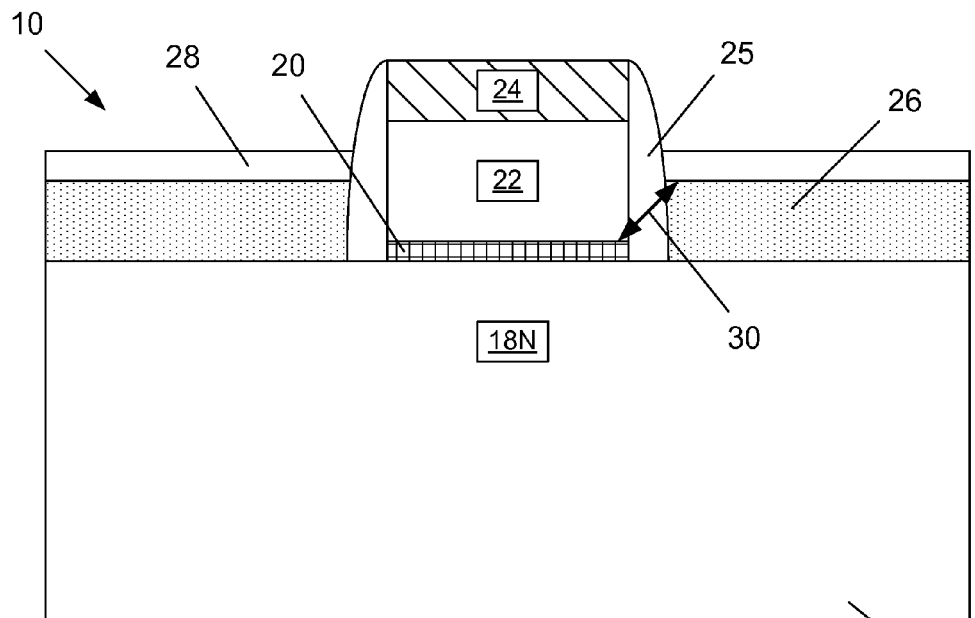
Figure 1B – Z-Z  (Prior Art)
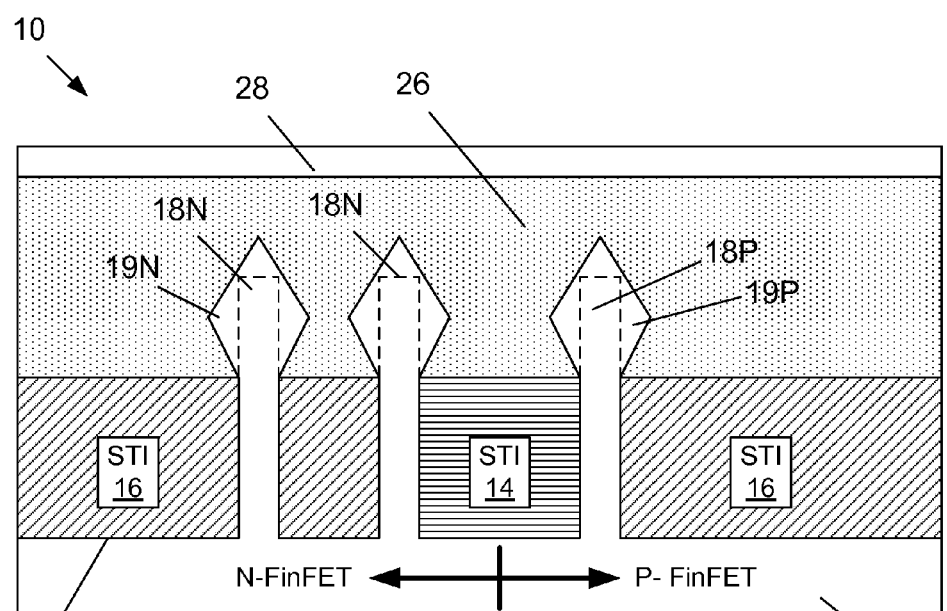
Figure 1B – Y-Y  (Prior Art)

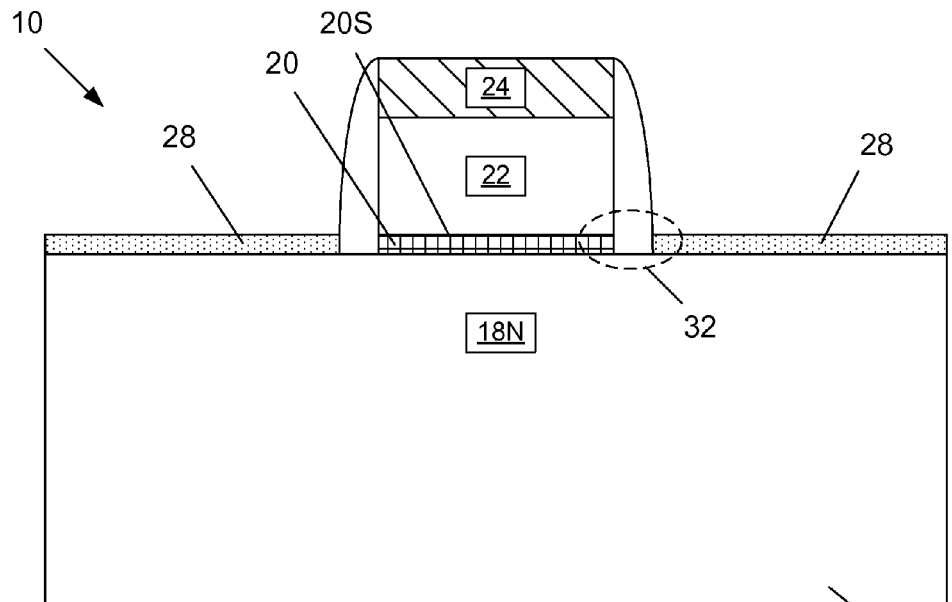
Figure 1C – Z-Z (Prior Art)
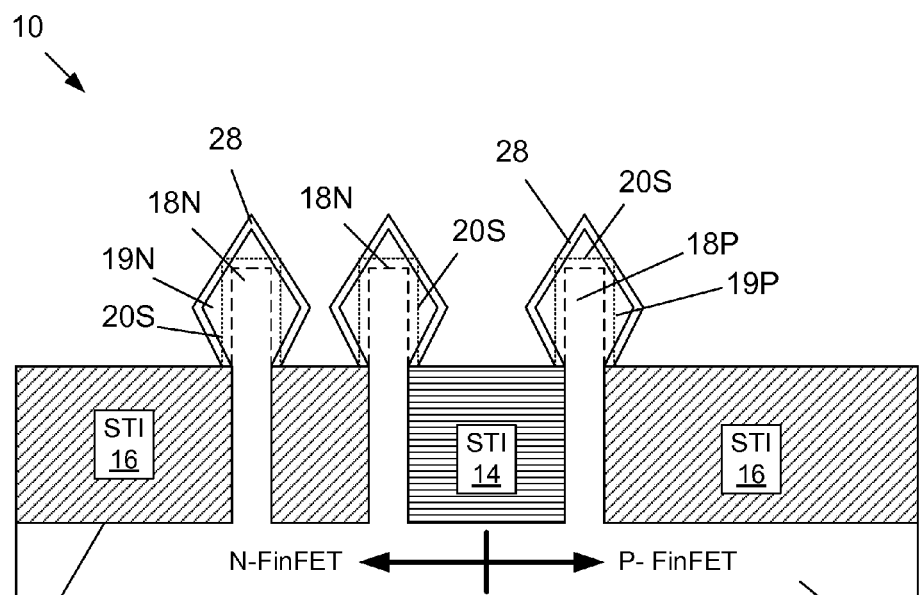
Figure 1C – Y-Y (Prior Art)

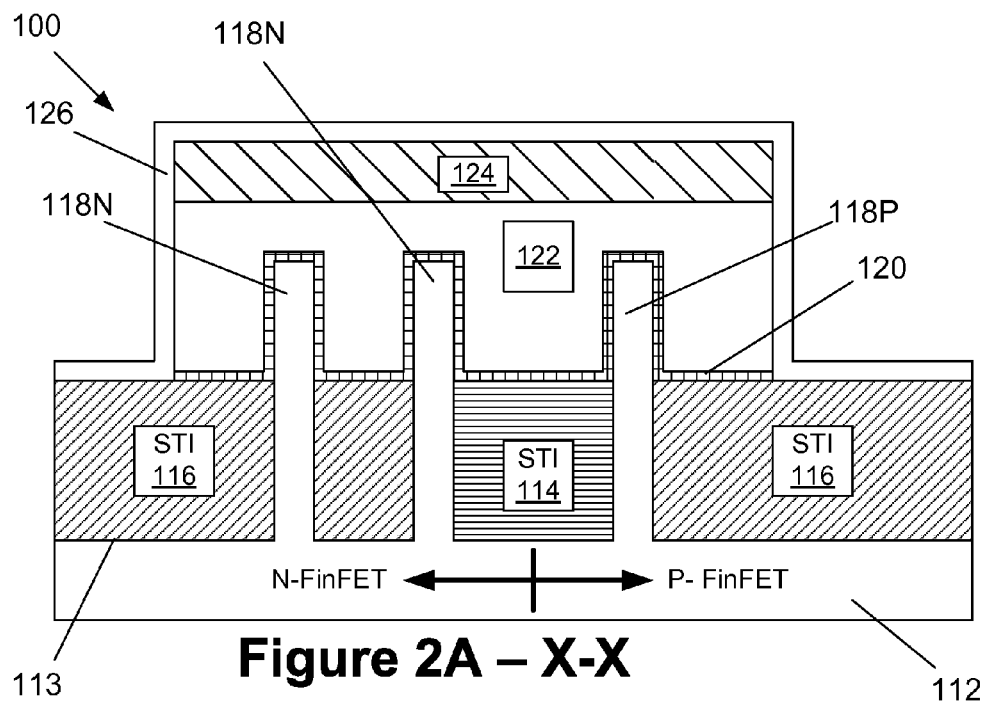
Figure 2A – X-X
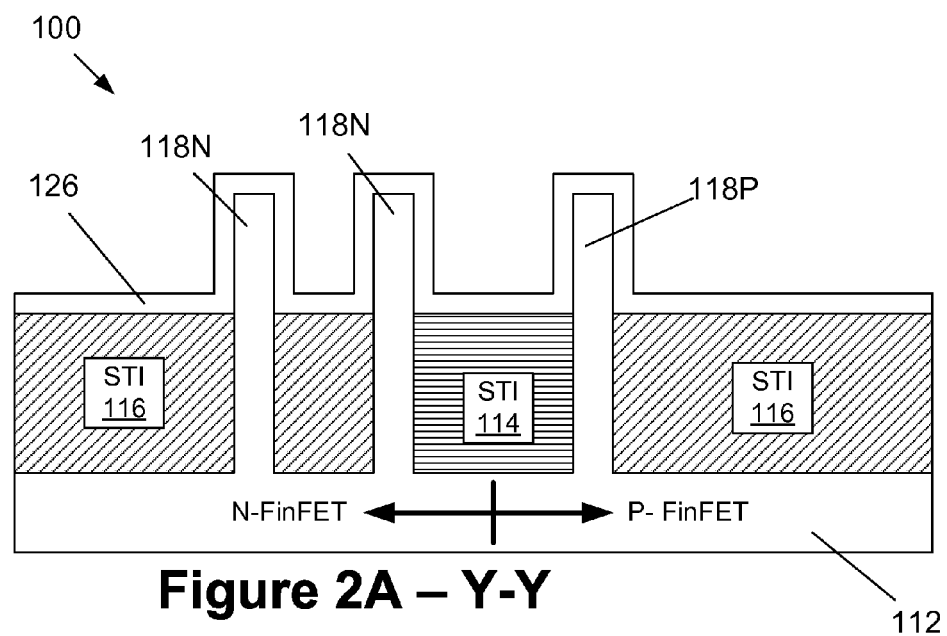
Figure 2A – Y-Y

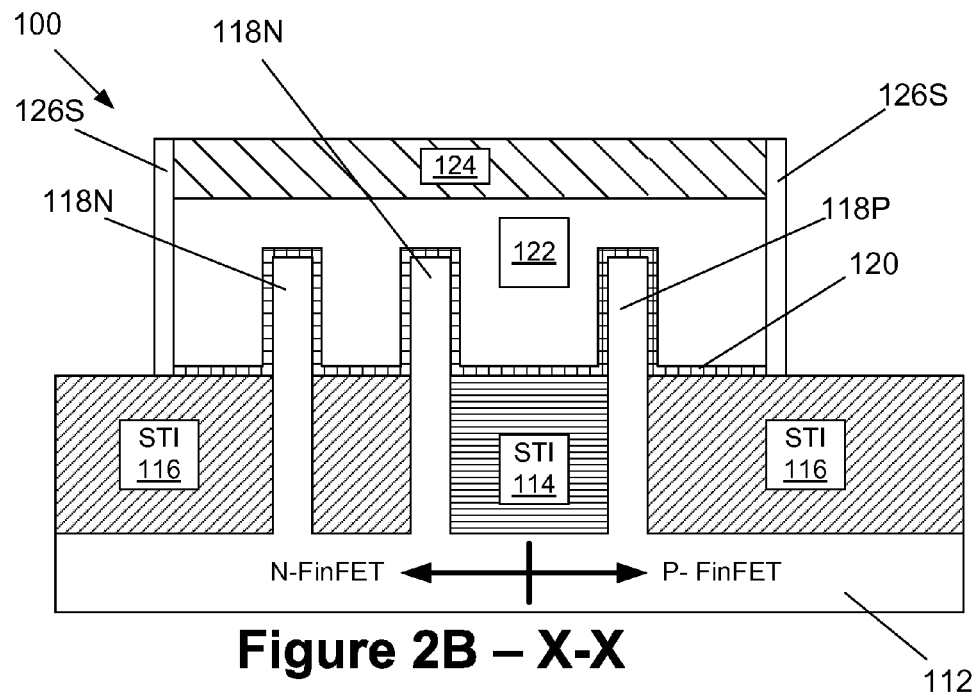
Figure 2B – X-X
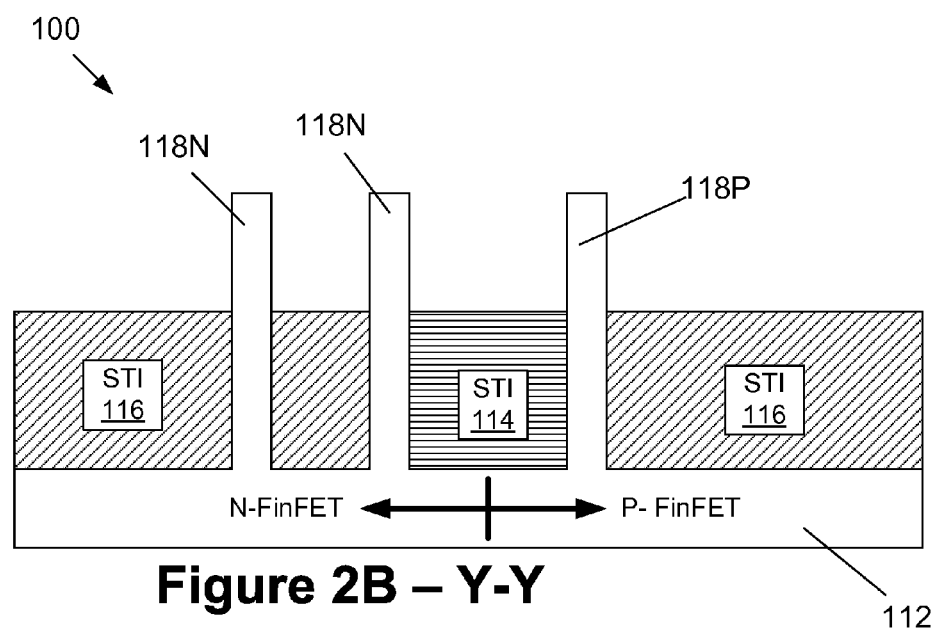
Figure 2B – Y-Y

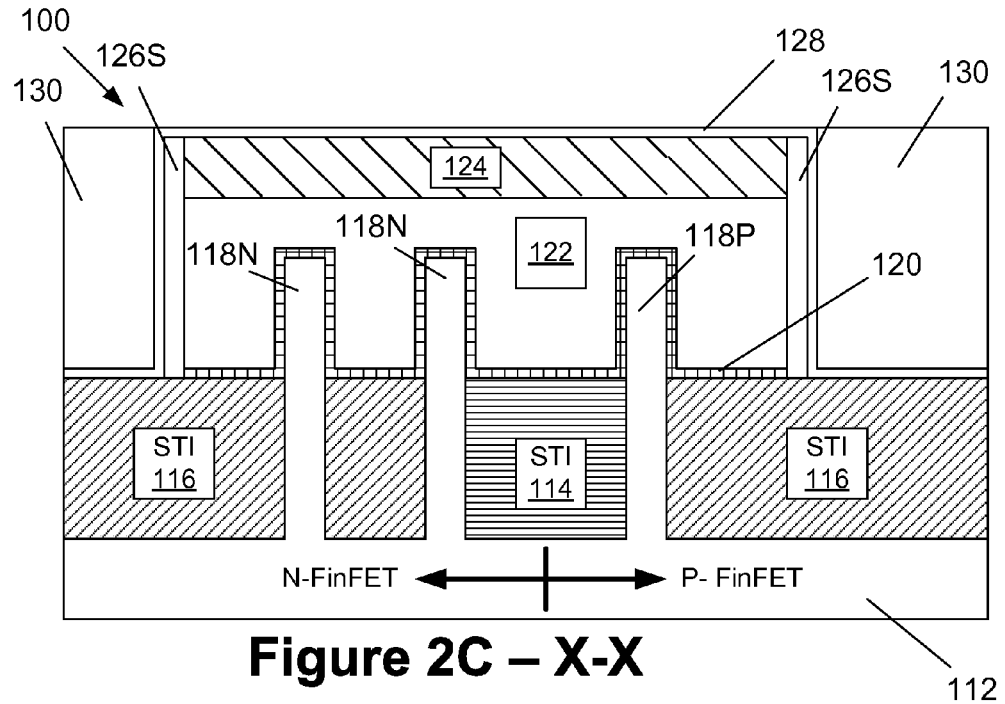
Figure 2C – X-X
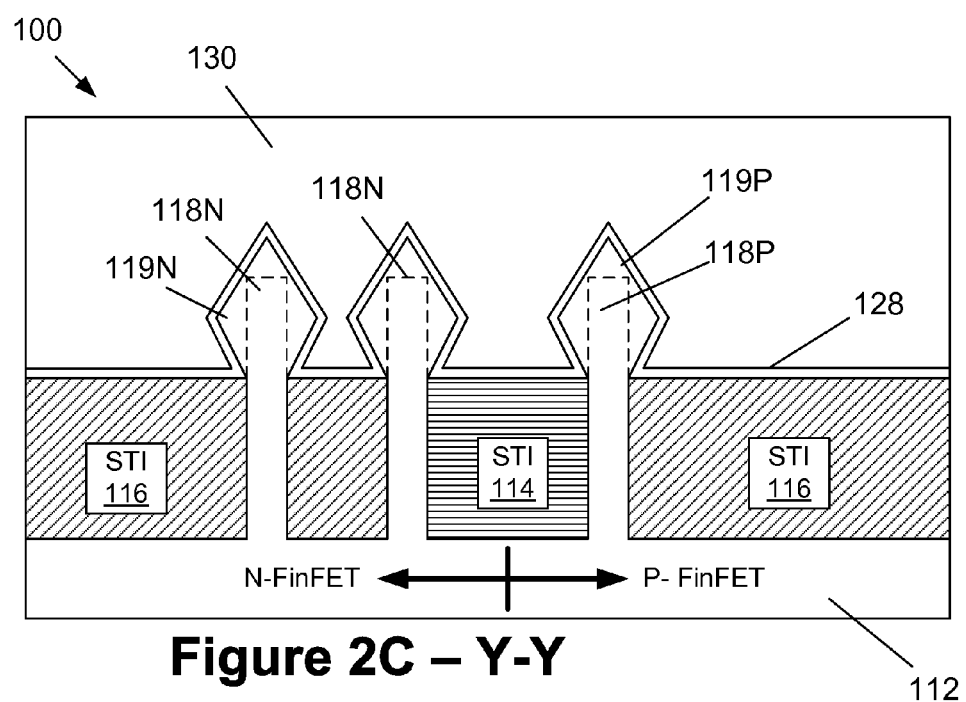
Figure 2C – Y-Y

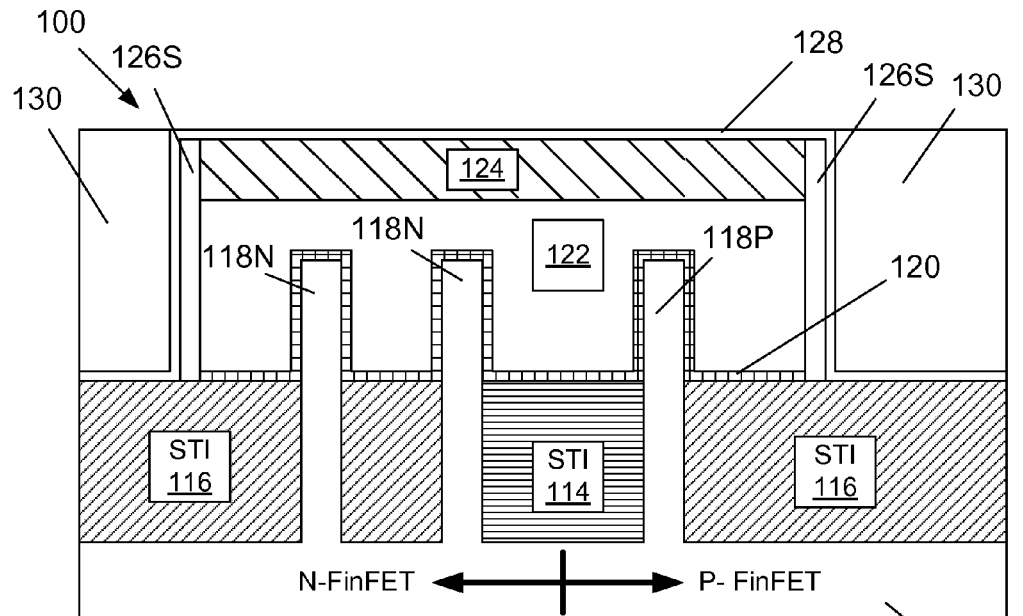
Figure 2D – X-X
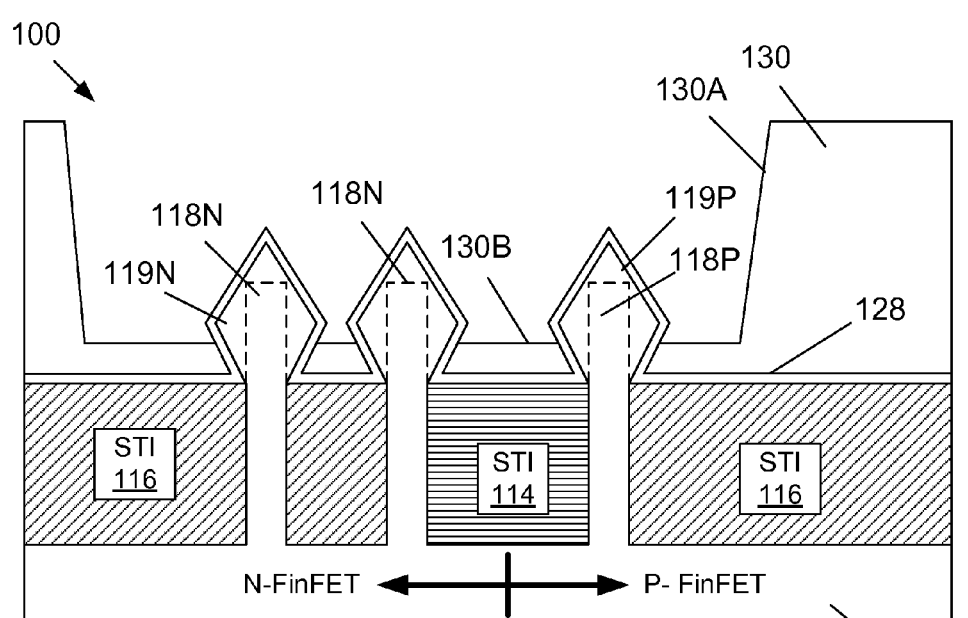
Figure 2D – Y-Y

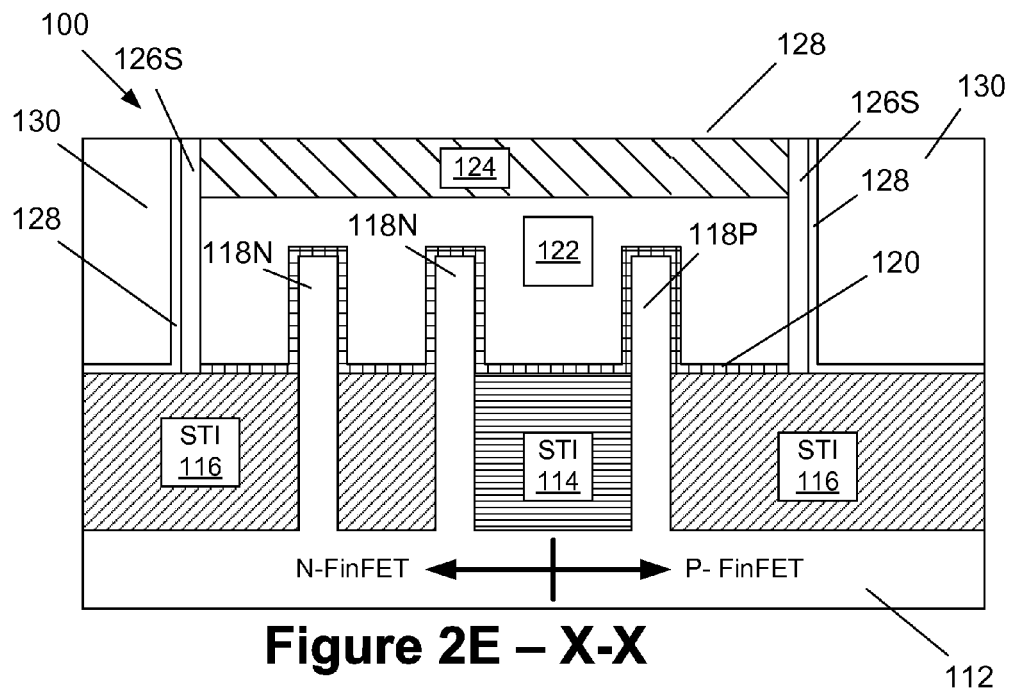
Figure 2E – X-X
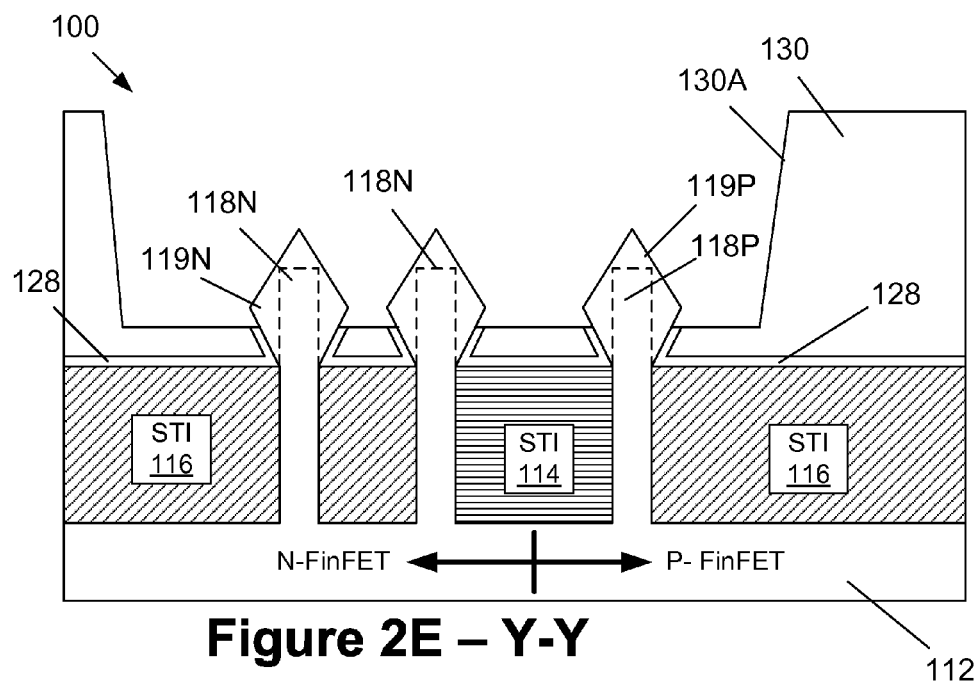
Figure 2E – Y-Y

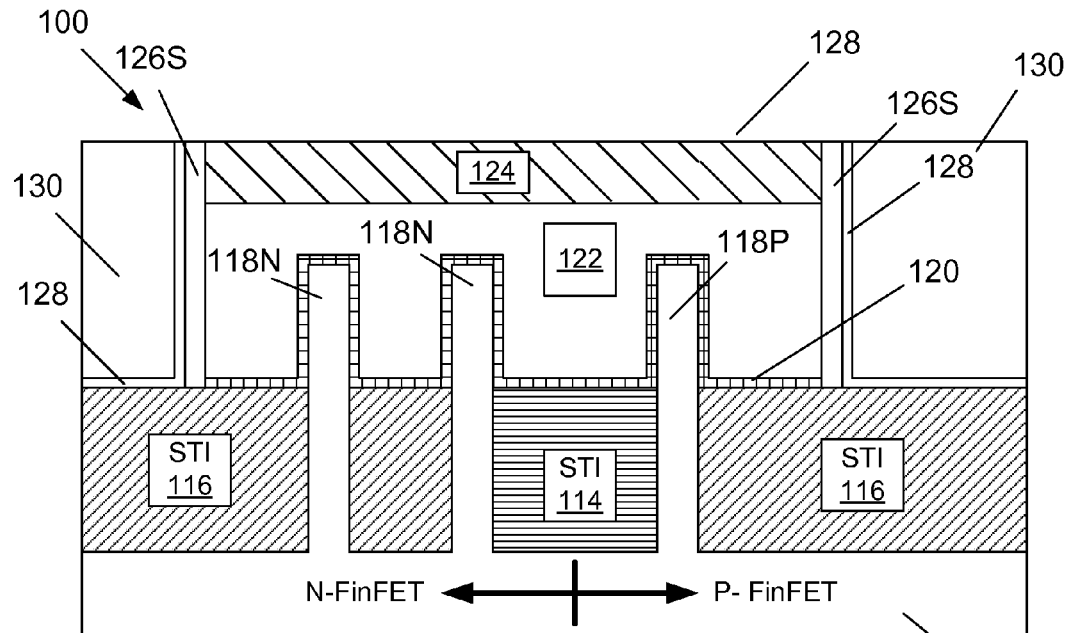
Figure 2F – X-X
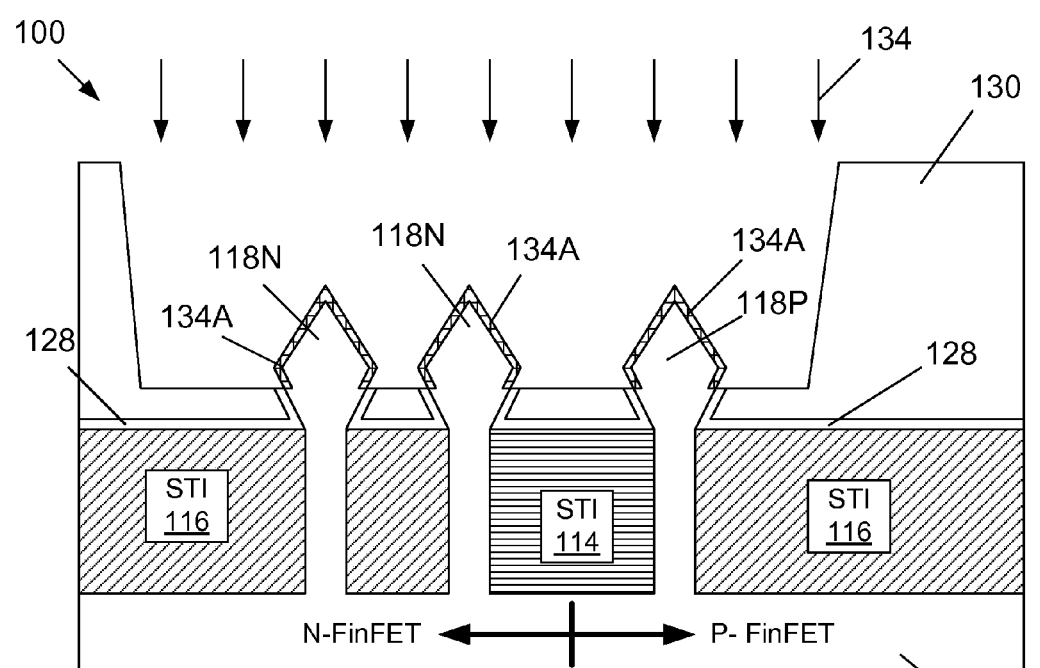
Figure 2F – Y-Y

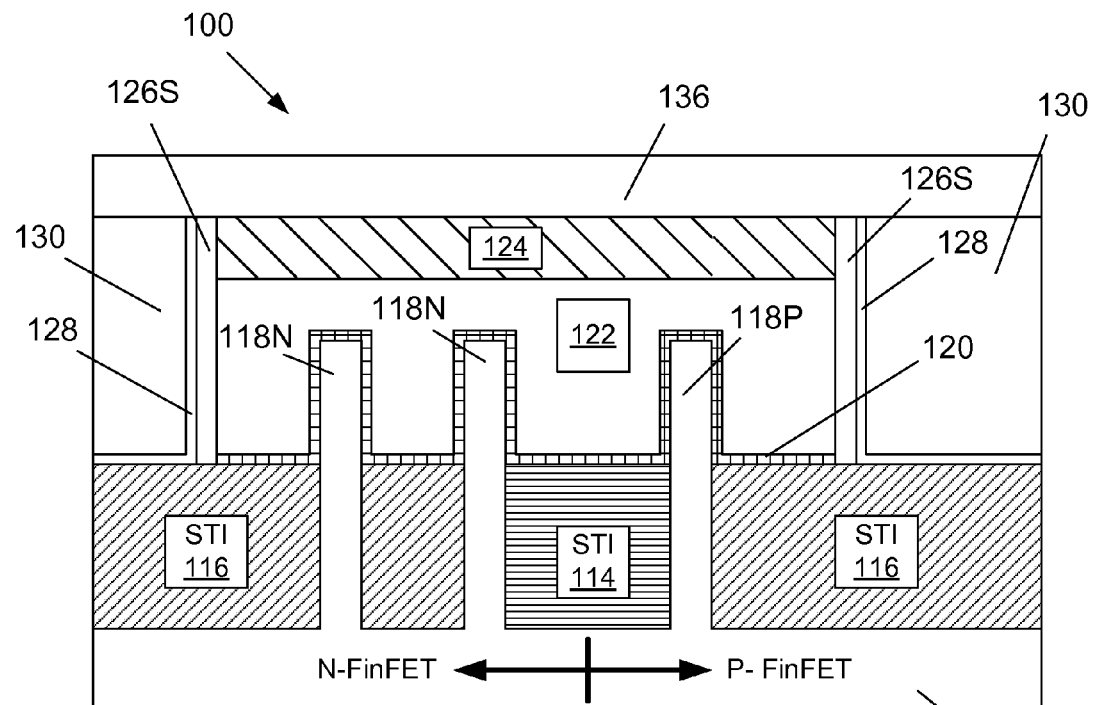
Figure 2G – X-X
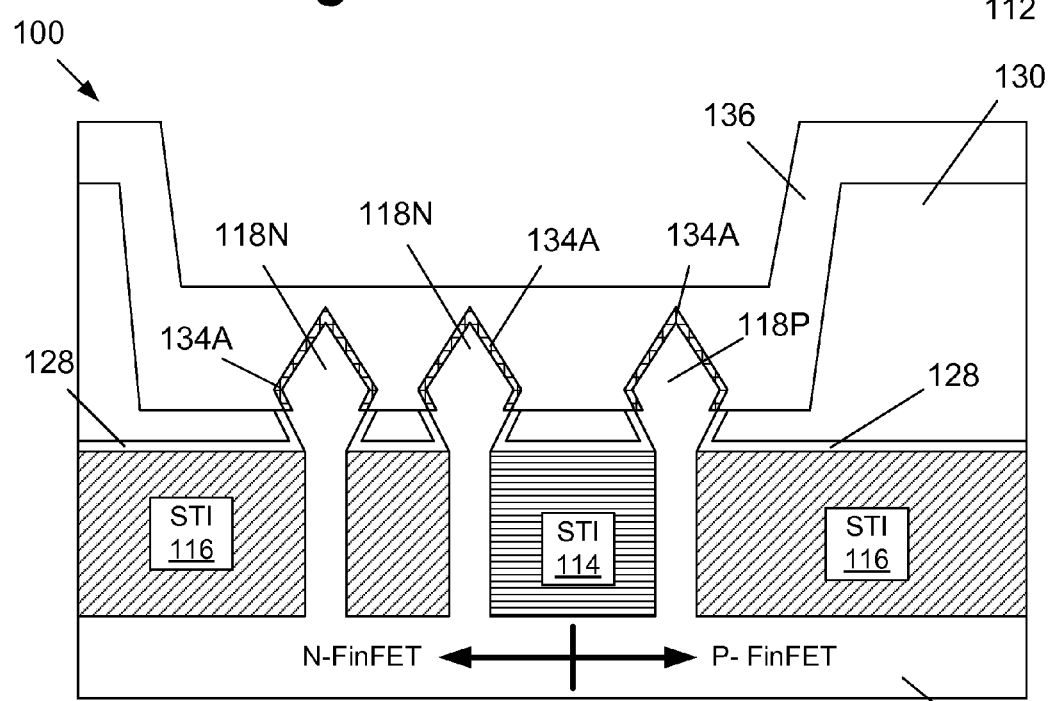
Figure 2G – Y-Y

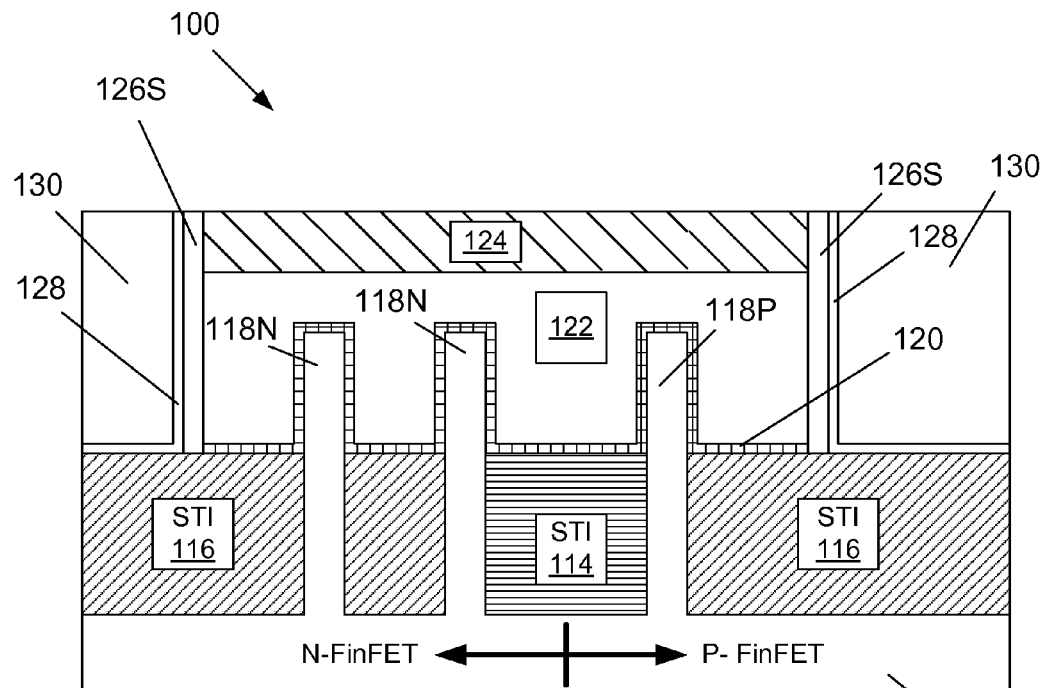
Figure 2H – X-X
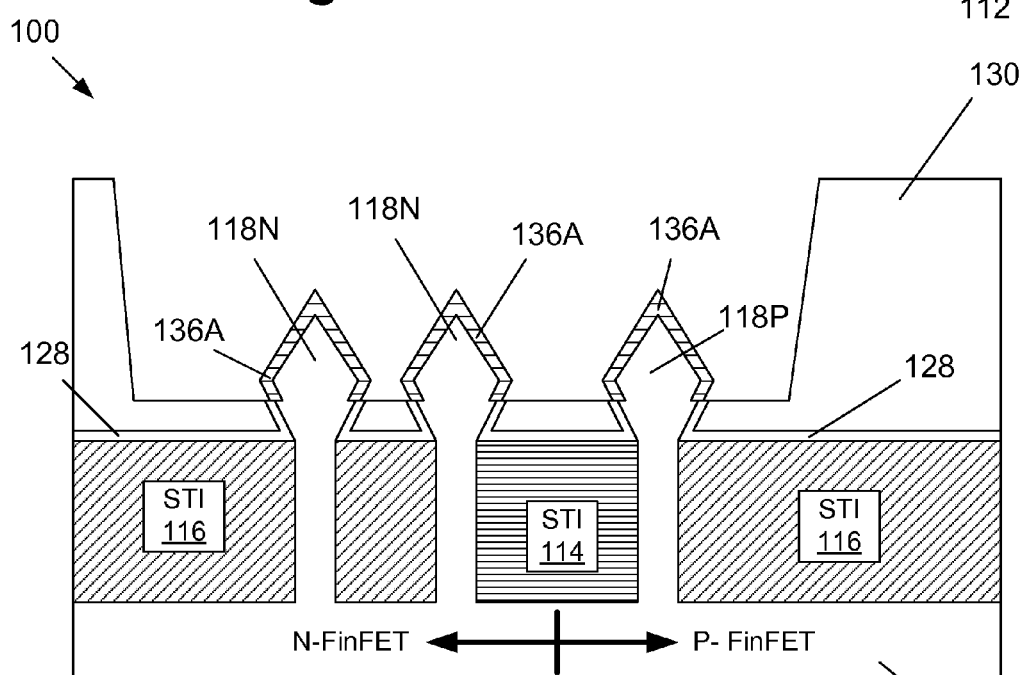
Figure 2H – Y-Y

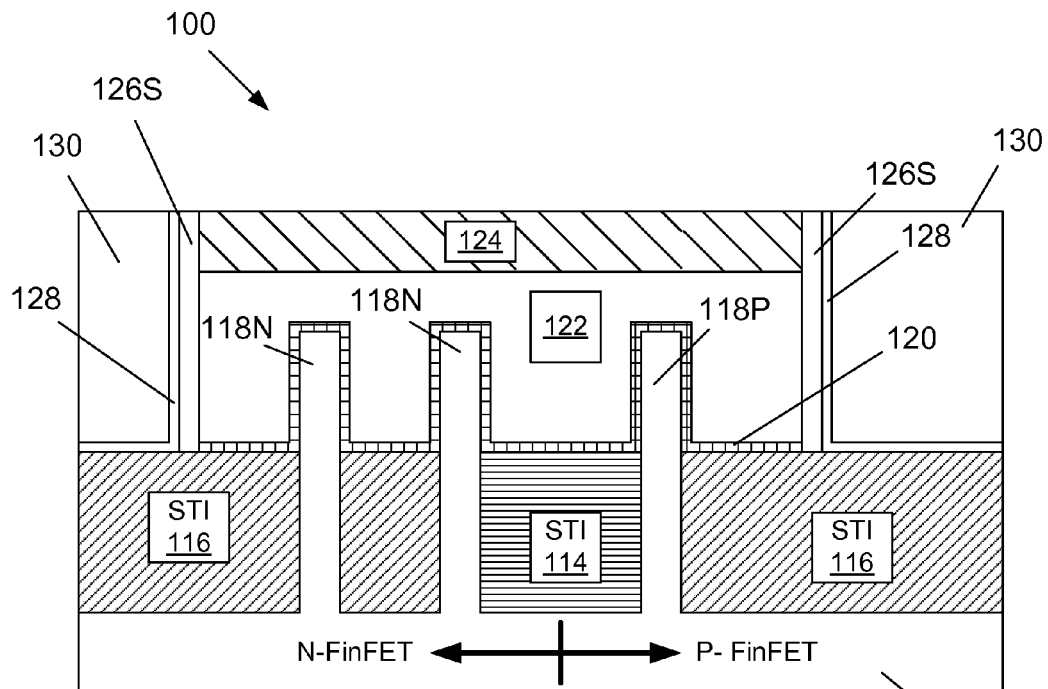
Figure 2I – X-X
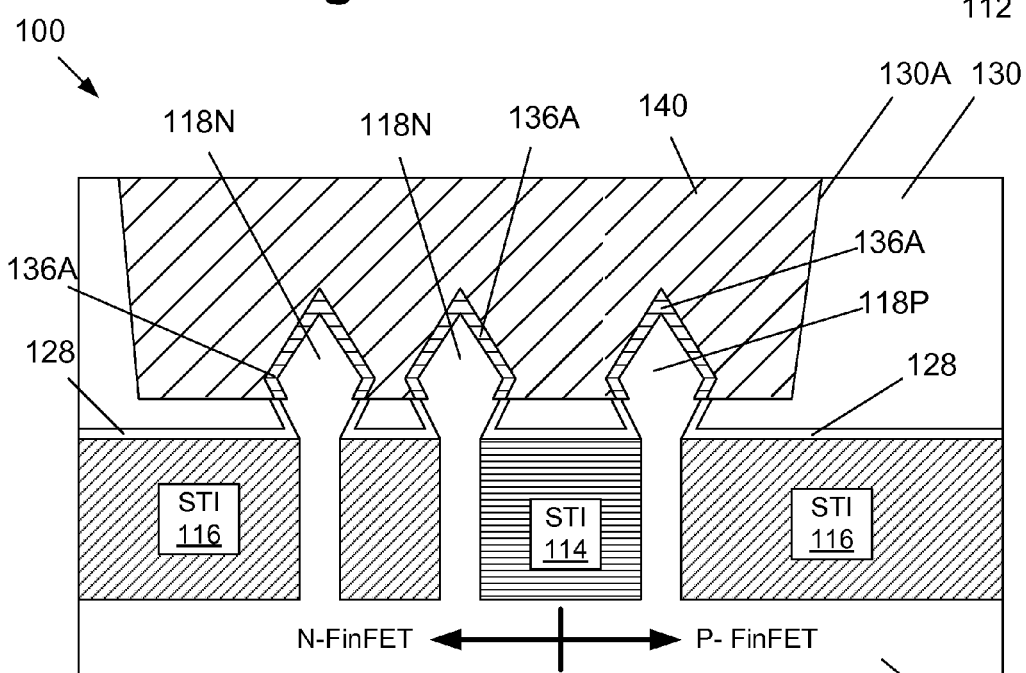
Figure 2I – Y-Y

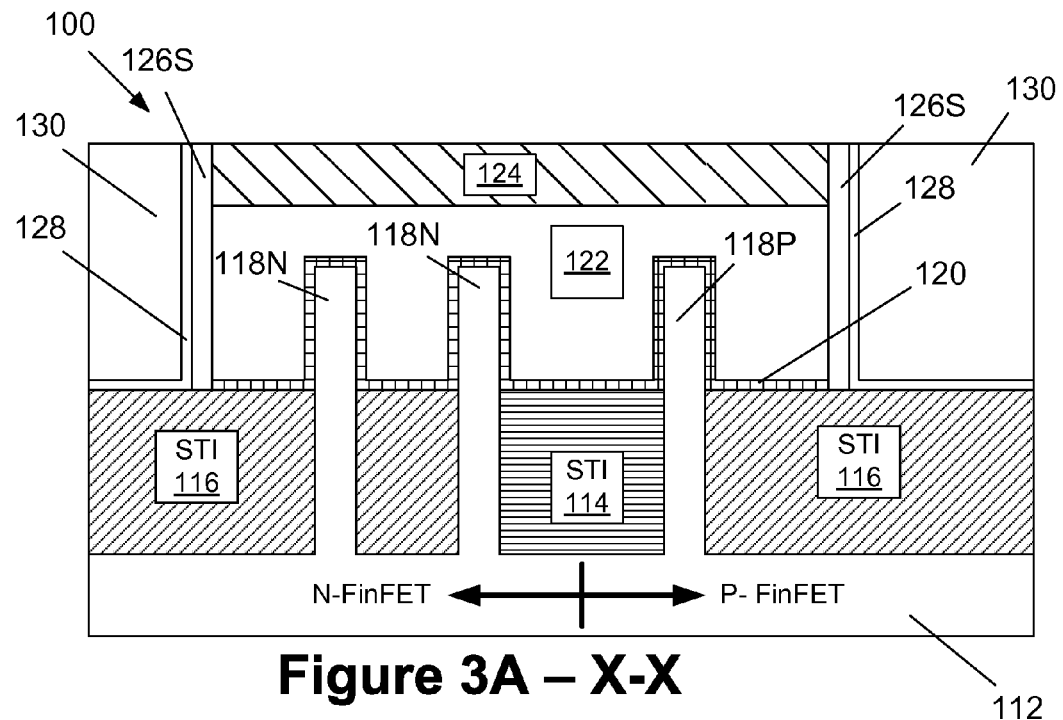
Figure 3A – X-X
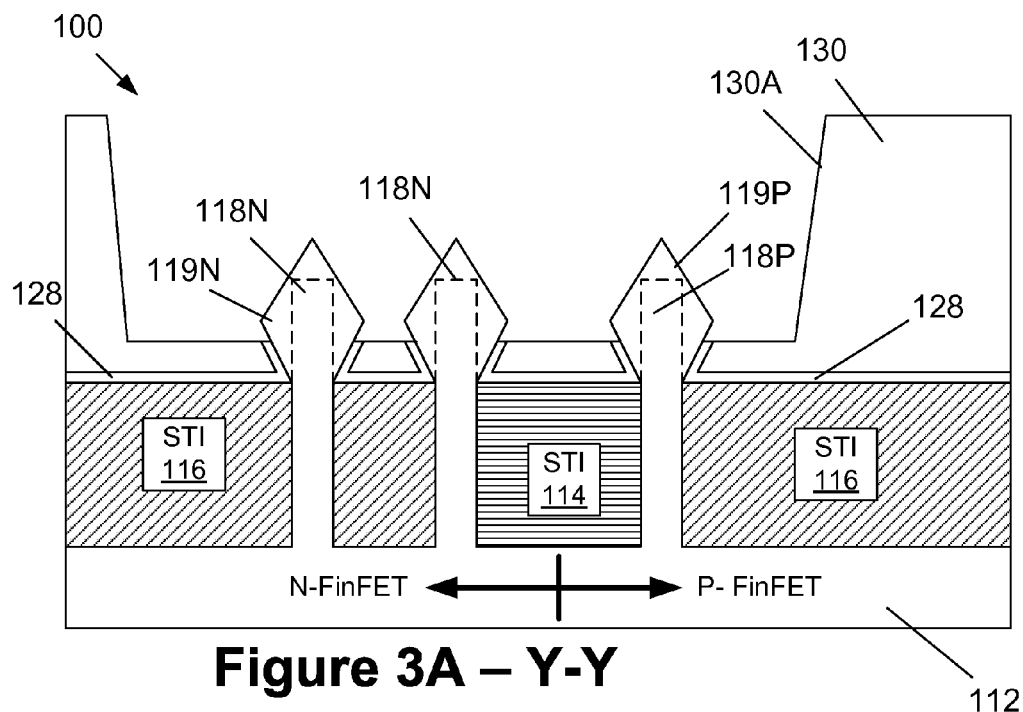
Figure 3A – Y-Y

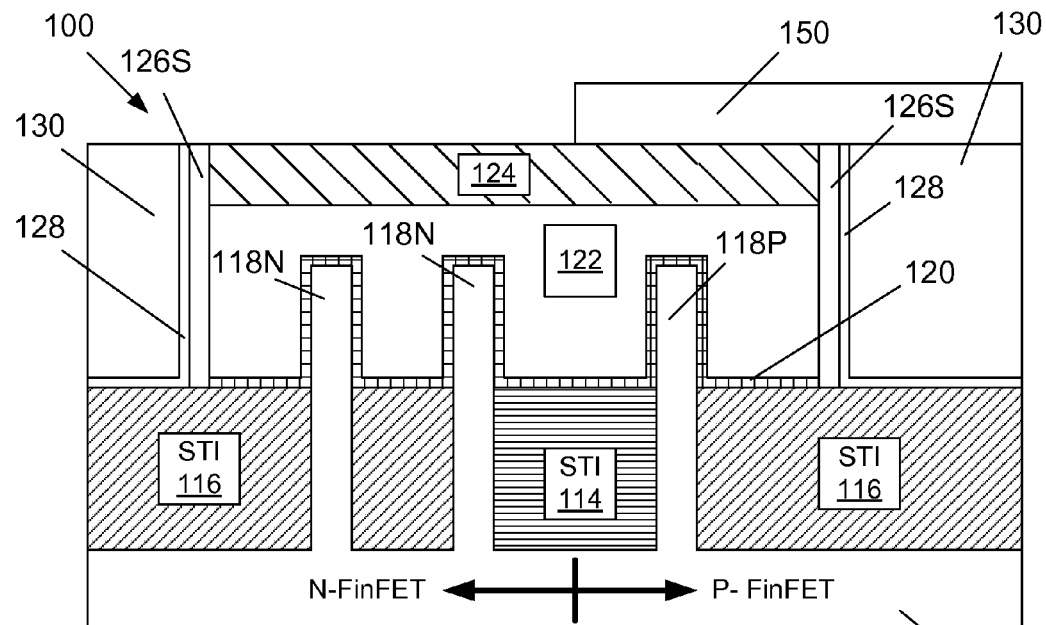
Figure 3B – X-X
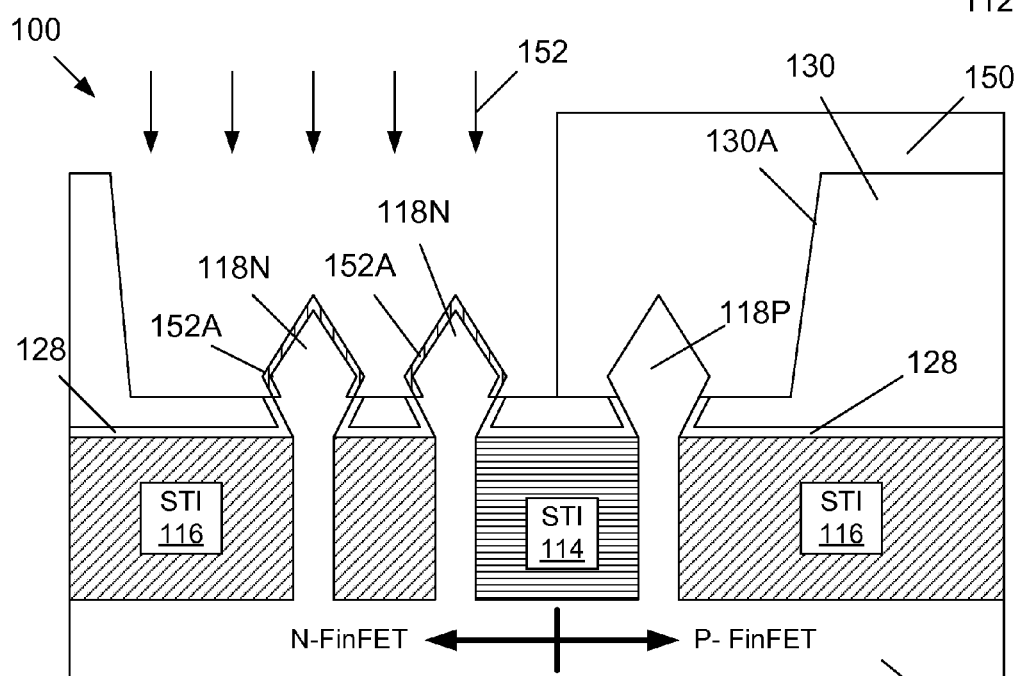
Figure 3B – Y-Y

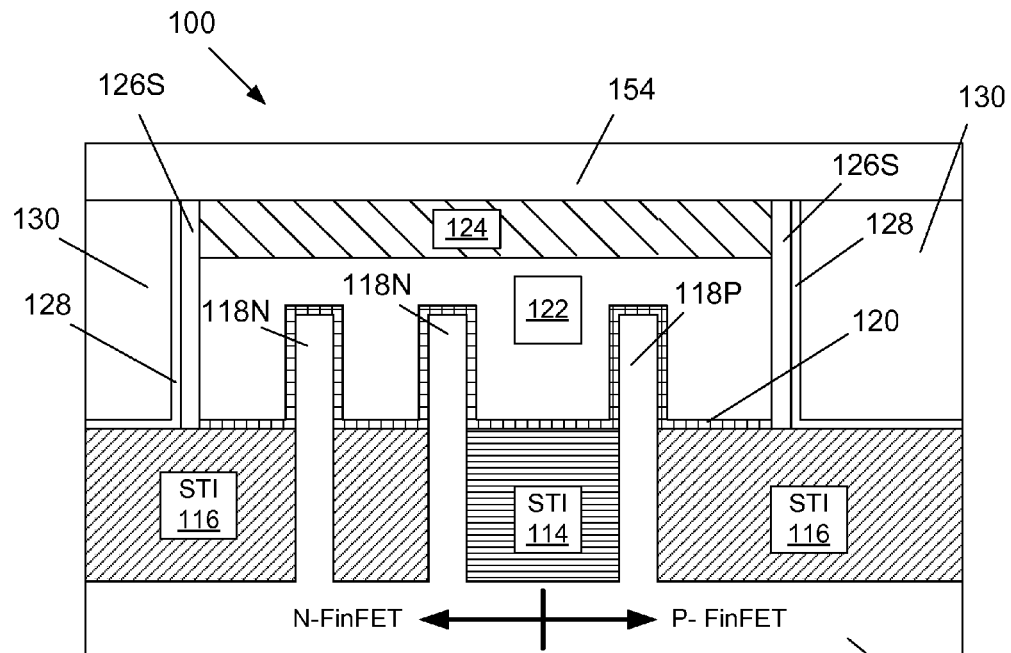
Figure 3C – X-X
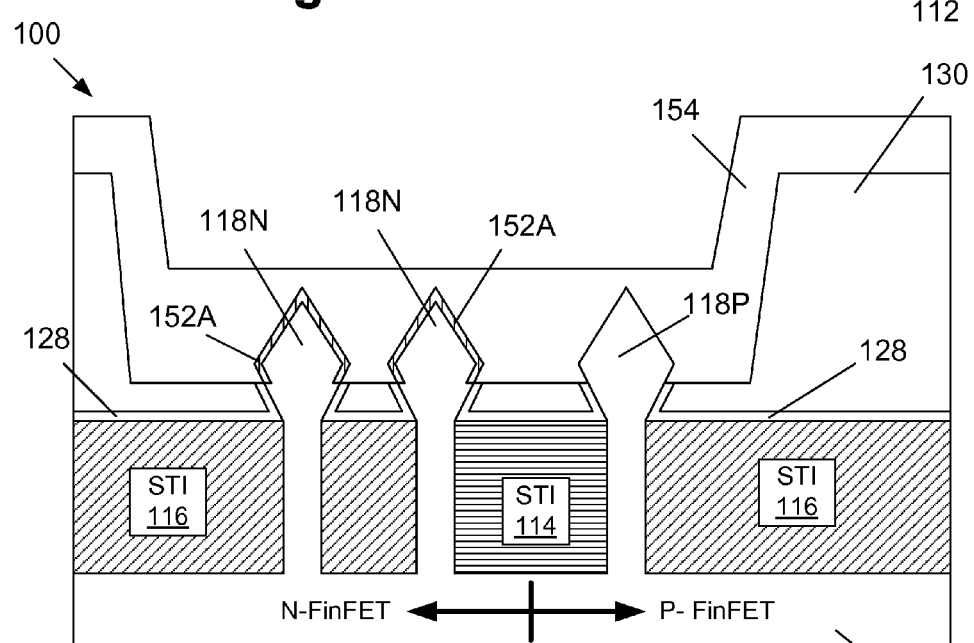
Figure 3C – Y-Y

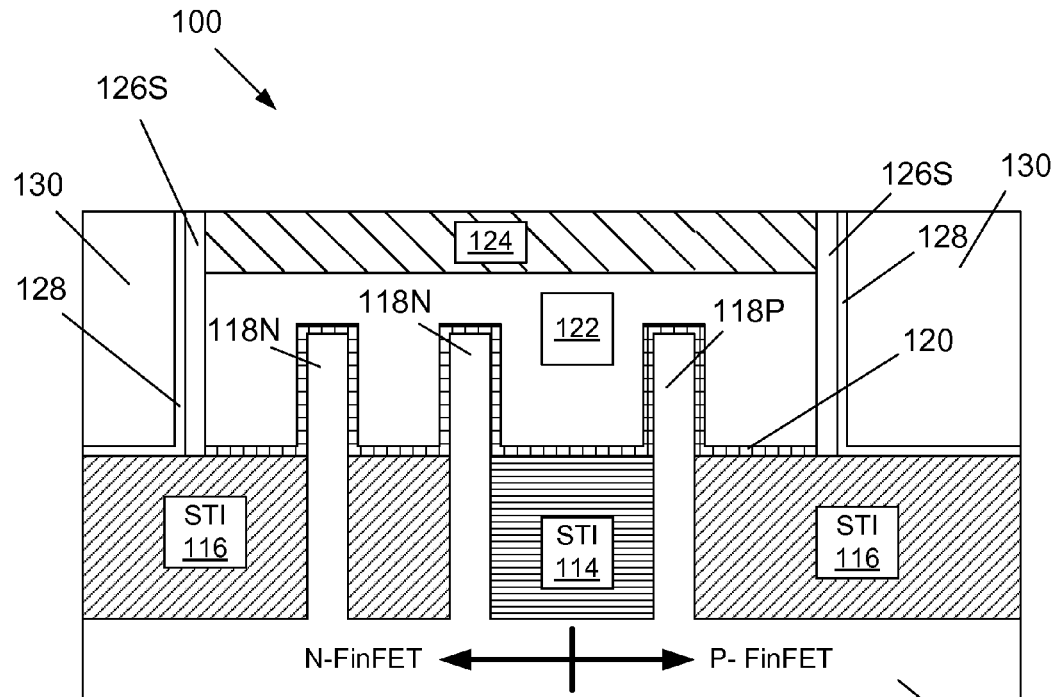
Figure 3D – X-X
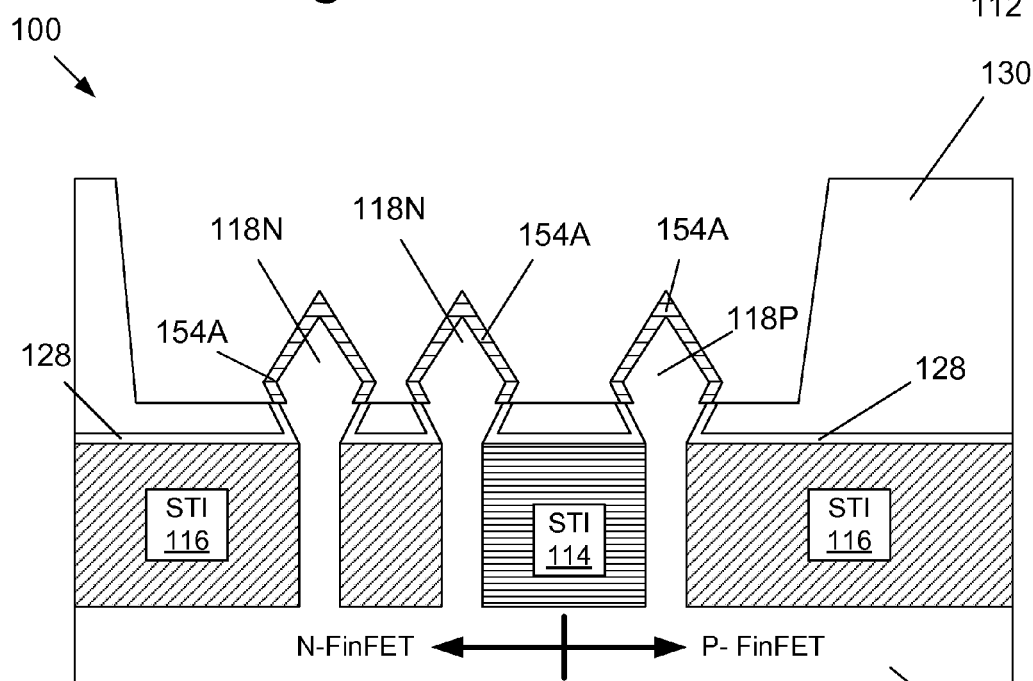
Figure 3D – Y-Y

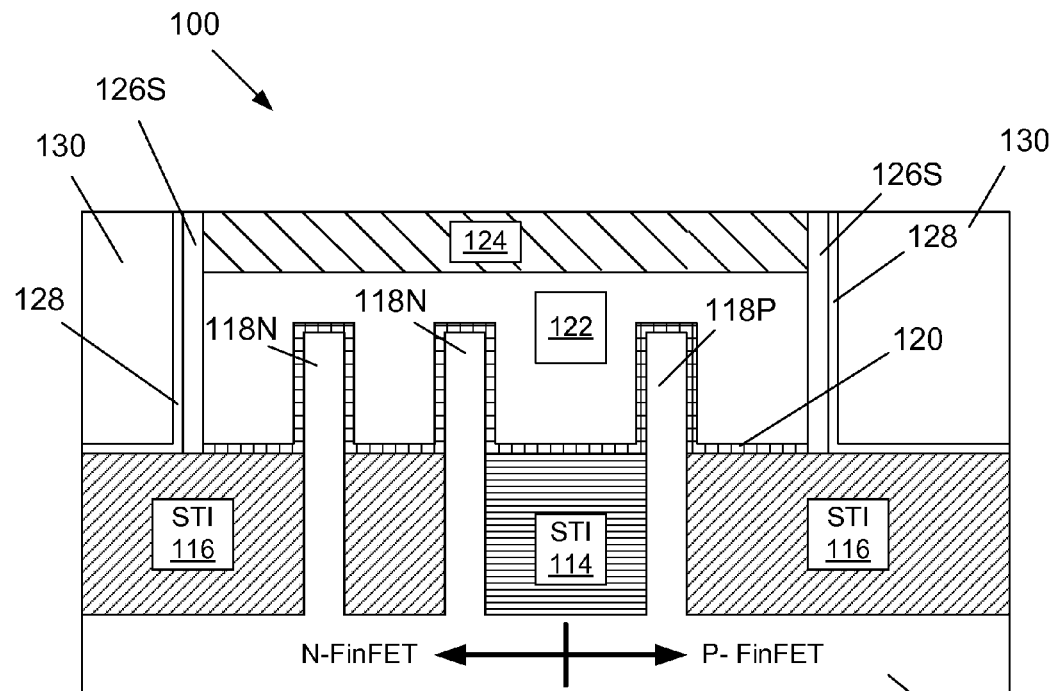
Figure 3E – X-X
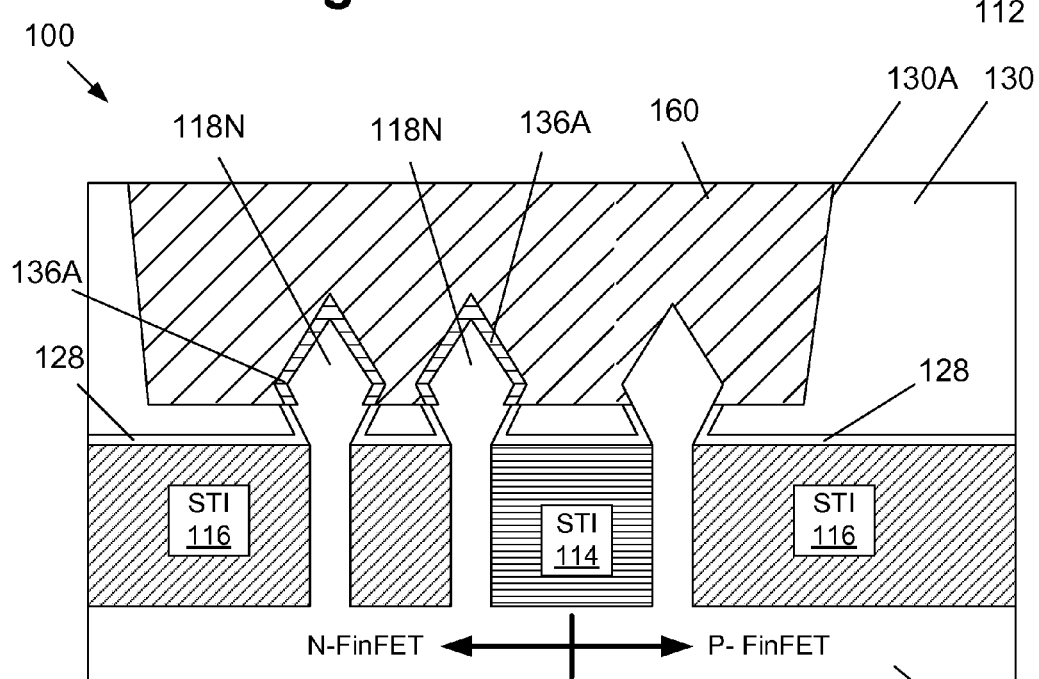
Figure 3E – Y-Y

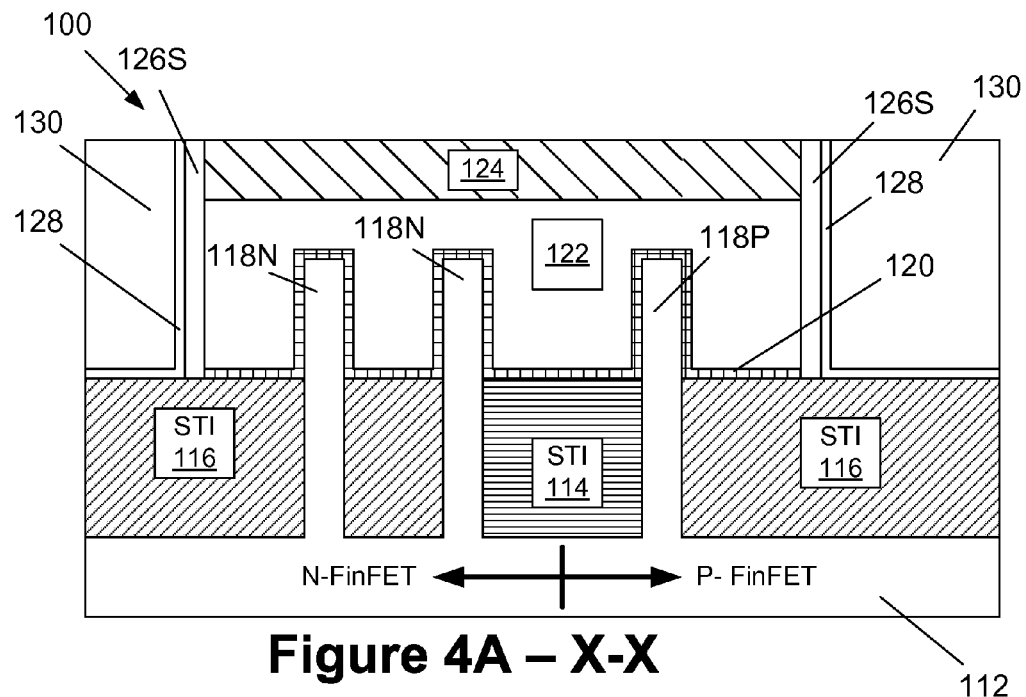
Figure 4A – X-X
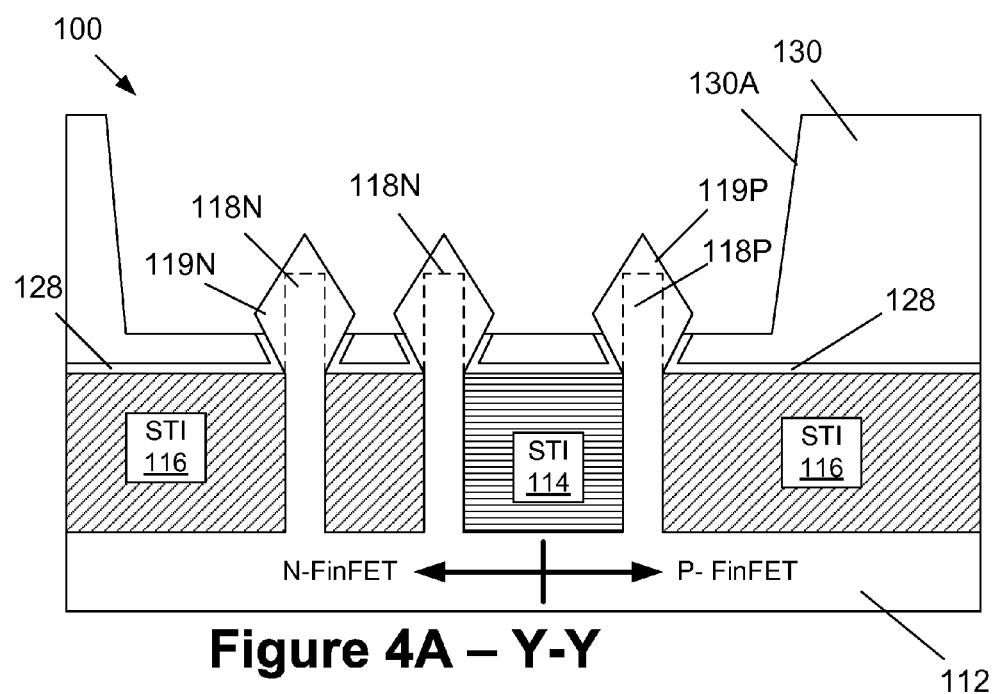
Figure 4A – Y-Y

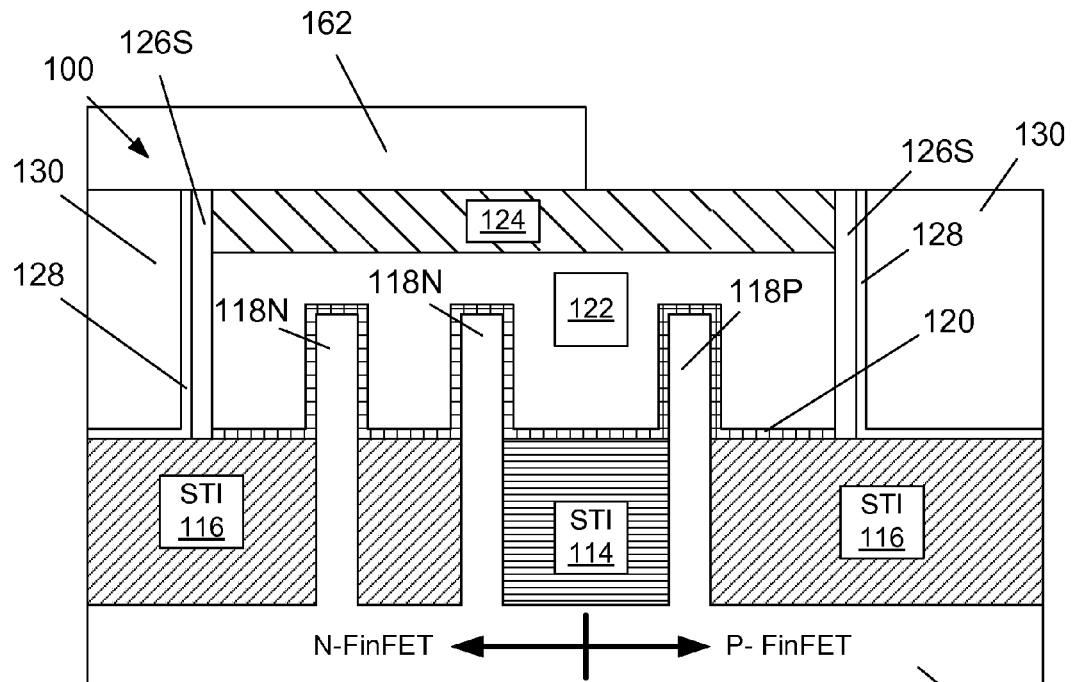
Figure 4B – X-X
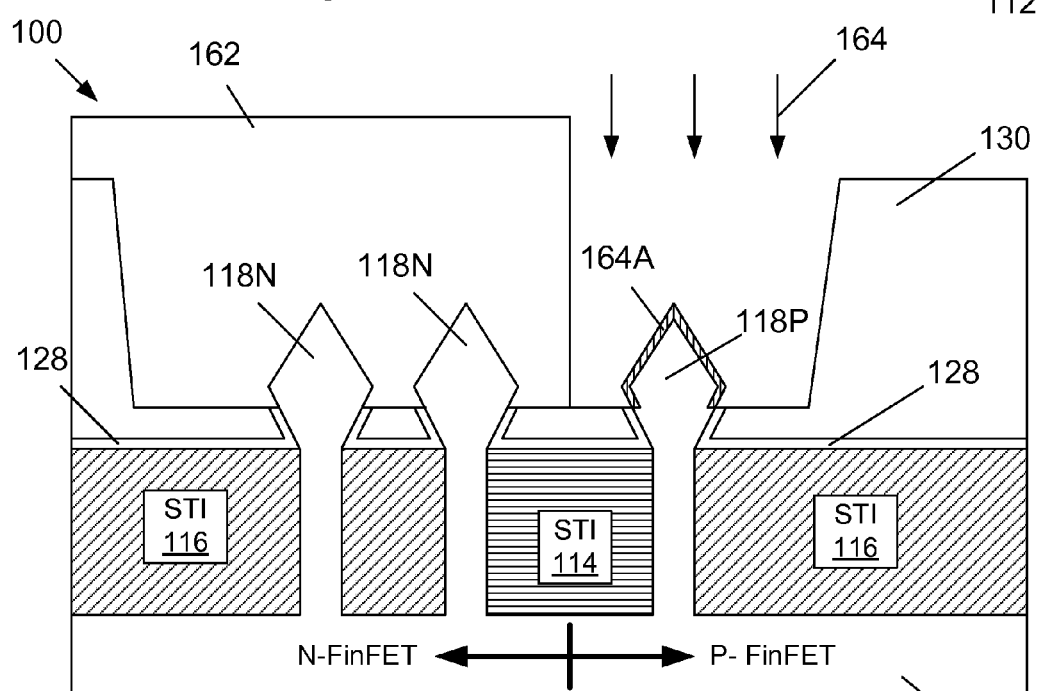
Figure 4B – Y-Y

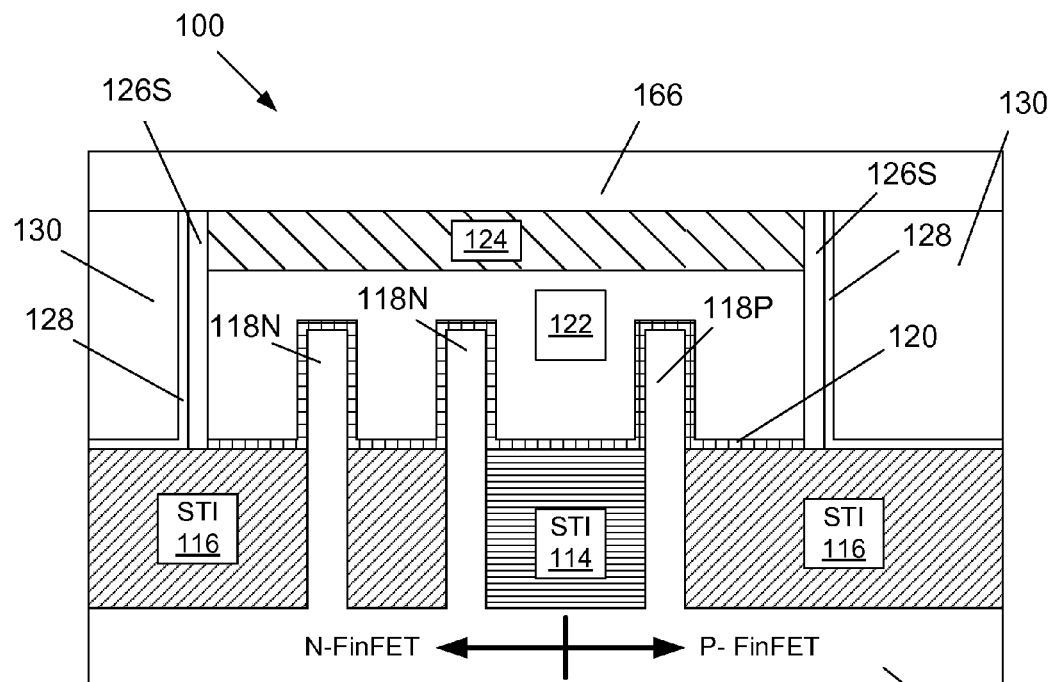
Figure 4C – X-X
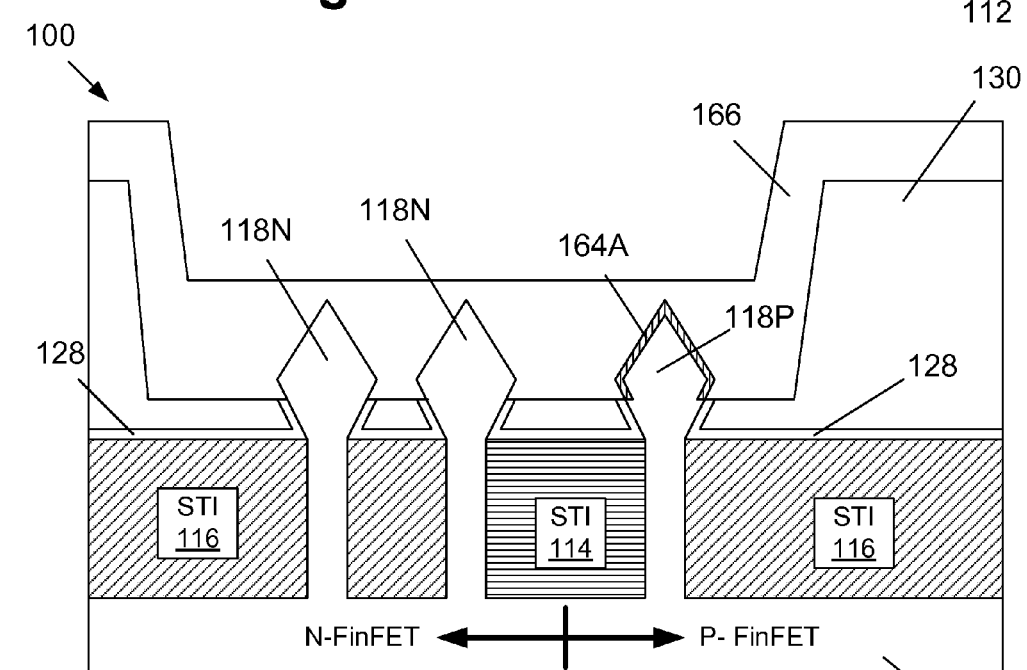
Figure 4C – Y-Y

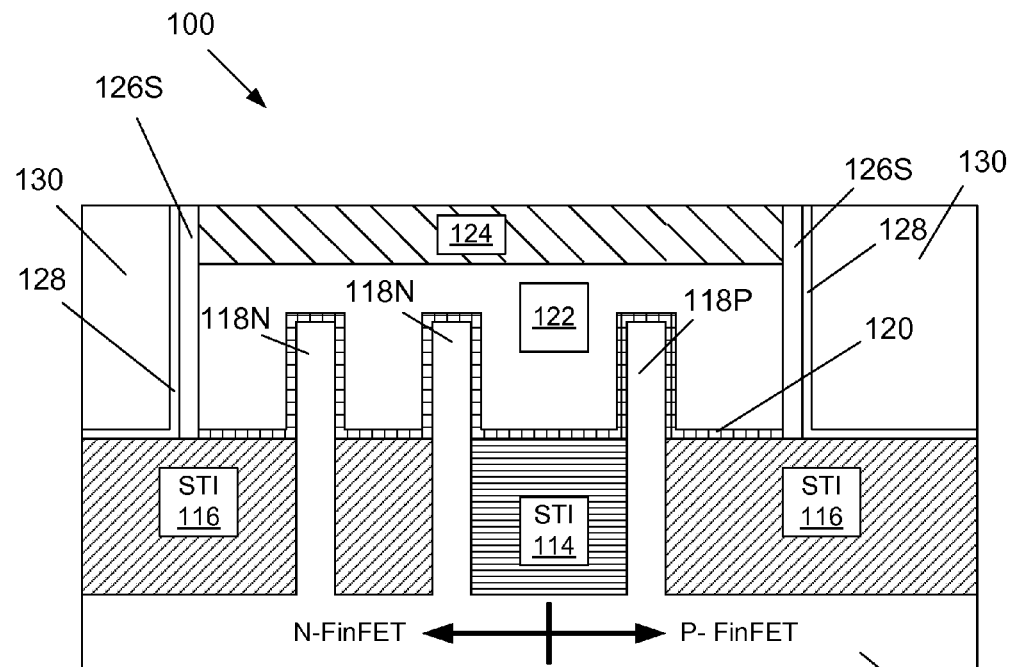
Figure 4D – X-X
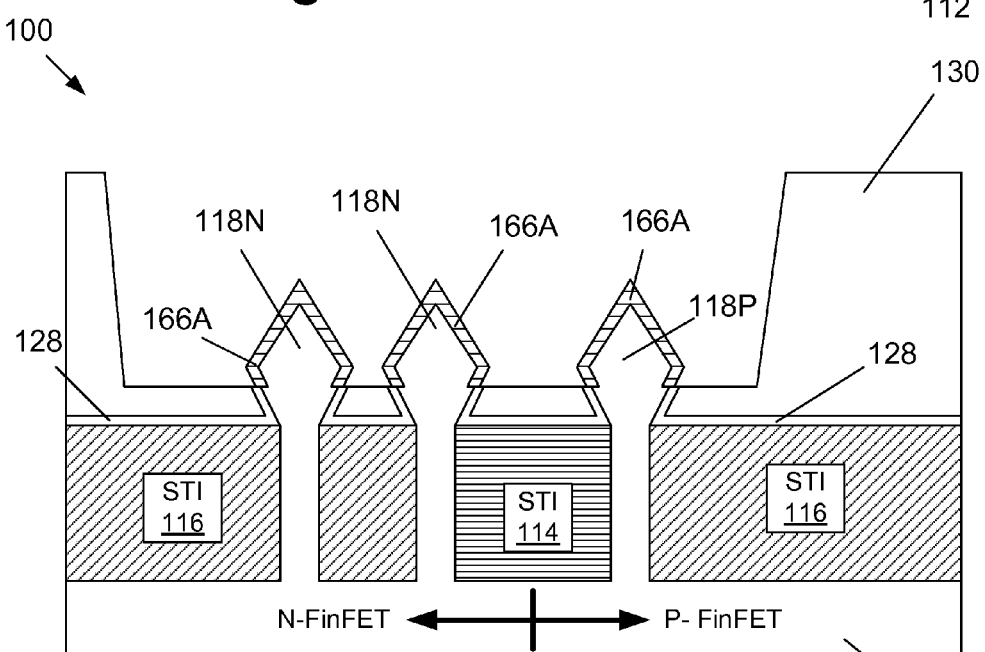
Figure 4D – Y-Y

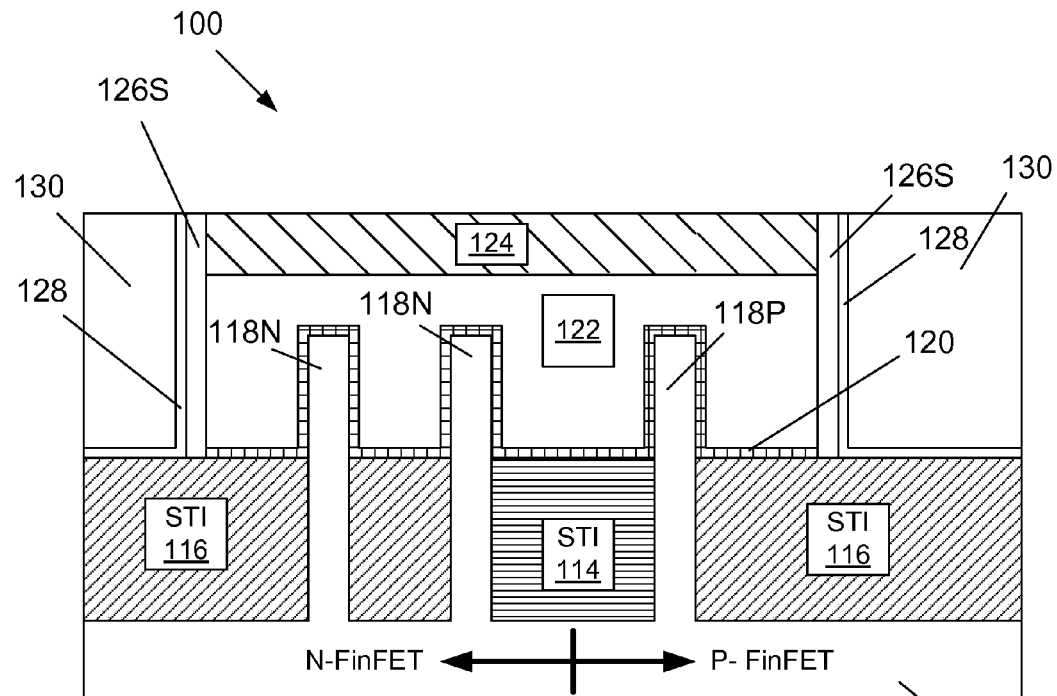
Figure 4E – X-X
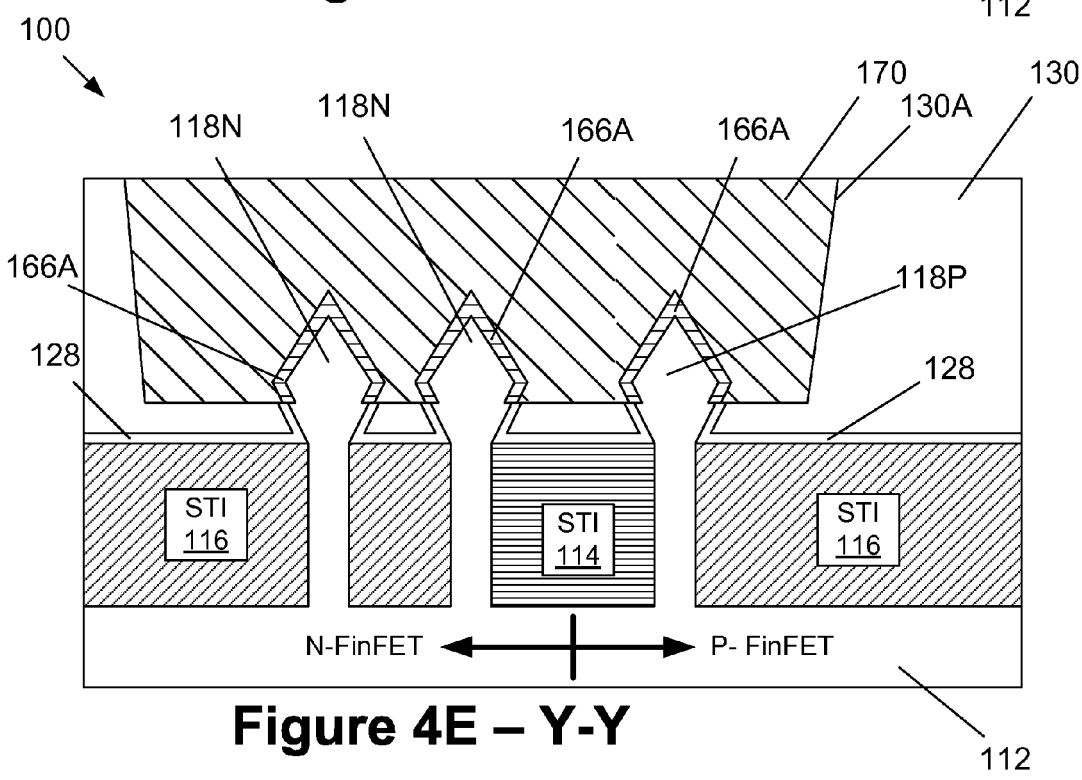
Figure 4E – Y-Y

METHODS OF FORMING CONTACTS TO SOURCE/DRAIN REGIONS OF FINFET DEVICES

BACKGROUND OF THE INVENTION

1. Field of the Invention

Generally, the present disclosure relates to the manufacture of sophisticated semiconductor devices, and, more specifically, to various methods of forming conductive contacts to the source/drain regions of FinFET devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

One problem encountered in manufacturing FinFET devices will now be described with reference to FIGS. 1A-1F. FIG. 1A is a perspective view of an illustrative FinFET semiconductor device 10 that is formed above a semiconducting substrate 12. The device 10 includes a plurality of fins 14, a gate electrode 13, sidewall spacers 17 and a gate cap layer 15. FIG. 1A depicts the locations where various cross-sectional views of the device 10 will be taken in the drawings discussed below. More specifically, view "X-X" is a cross-sectional view taken through the gate electrode 13 in a direction that is parallel to the long axis of the gate electrode 13, i.e., in the gate width direction, view "Y-Y" is a cross-sectional view taken through the fins 14 in a direction that is transverse to the long axis of the fins 14 and view "Z-Z" is a cross-sectional view taken along the long axis of one of the fins 14. It should be understood that FIG. 1A is only provided to show the location of the various cross-sectional views depicted in the drawings below, and many aspects discussed below are not depicted in FIG. 1A so as to not overly complicate the device 10 depicted in FIG. 1A. Moreover, the reference numbers employed below for various structures may not match the reference numbers depicted in FIG. 1A.

FIGS. 1B-1C depict the illustrative situation where an N-type FinFET device will be formed adjacent to a P-type FinFET device, such as in an SRAM structure, and where the two devices will ultimately share a common gate structure. The N-type FinFET device is separated from the P-type FinFET device by an illustrative shallow trench isolation region 14 that is formed in the substrate 12. Illustrative isolation regions 16 are also depicted. In the depicted example, the common gate structure for both devices will be formed using a so-called "replacement gate" or "gate last" technique. As it relates to forming conductive contacts to the source/drain regions of a FinFET device, there are basically two different techniques that device manufacturers employ. One technique, described below with reference to FIG. 1B, generally involves performing a so-called "fin merge" process and forming a substantially planar metal silicide region on top of the "merged fins." Another technique generally involves forming a metal silicide region that "wraps around" the fins, as described below with reference to FIG. 1C. In both cases, a conductive contact material is then formed so as to conductively contact the metal silicide regions. However, merged fins are typically not desirable in designs where the space between the fins of different voltage node is tight, e.g., SRAM designs and high density logic designs, since merged fins limits the density of such designs.

At the point of fabrication depicted in FIG. 1B, a plurality of fins 18N have been formed for the N-type FinFET device and a single fin 18P has been formed for the P-type FinFET device. The fins were formed by performing an etching process, such as a dry or wet etching process, through a patterned mask layer (not shown) to form a plurality of trenches 13 in the substrate 12 to thereby define the fins 18N, 18P. Also depicted in FIG. 1B is a sacrificial gate structure that is comprised of a sacrificial gate insulation layer 20, a sacrificial gate electrode 22 and a gate cap layer 24. A sidewall spacer 25 is also depicted in FIG. 1B. Such structures and layers may be formed using a variety of different materials and by performing a variety of known techniques. For example, the sacrificial gate insulation layer 20 may be comprised of silicon dioxide, the sacrificial gate electrode layer 22 may be comprised of polysilicon or amorphous silicon and the gate cap layer 24 may be comprised of silicon nitride. The layers of material depicted in FIG. 1B may be formed by any of a variety of different known techniques, e.g., a chemical vapor deposition (CVD) process, an atomic layer deposition (ALD) process, a thermal growth process, etc. The sacrificial gate structure may be formed by patterning the layers of material using traditional photolithography and etching processes. The gate cap layer 24 is typically relatively thick, e.g., about 40-80 nm, due to the etching processes it must withstand as the device is being fabricated, as discussed more fully below. The sidewall spacer 25 may have a base thickness of about 10 nm and it may be comprised of materials such as silicon nitride, silicon oxynitride, silicon nitride carbon, etc.

FIG. 1B depicts the device 10 after semiconducting materials 19N, 19P have been formed on the fins 18N, 18P, respectively, by performing known epitaxial deposition processes. The diamond-shaped nature of the semiconductor materials 19N, 19P is due to the crystalline structure of the substrate material. Dashed lines depict the outline of the original fins 18N, 18P. Thereafter, an epitaxial deposition process is performed so as to form a relatively large region of semiconducting material 26 that effectively merges the individual fins together and forms the source/drain regions for the device 10. Thereafter, a metal silicide region 28, e.g. nickel silicide, etc., is formed on the substantially planar upper surface of the semiconductor material 26 using known techniques, i.e., refractory metal deposition, heating to cause reaction between the refractory metal layer and contacted silicon regions, followed by removal of unreacted refractory metal. Metal silicide regions are typically formed in the source/drain regions of a transistor to reduce the resistance when a conductive contact is formed to establish electrical connection to the source/drain regions. The metal silicide regions 28 depicted herein may be made using a variety of different refractory metals, e.g., nickel, platinum, cobalt, etc., or combinations thereof, and they may be formed using techniques that are well known to those skilled in the art. A conductive contact (not shown in FIG. 1B) is formed so as to conductively contact the metal silicide region 28.

FIG. 1C generally depicts the structure resulting from performing the above-mentioned wrap-around techniques to form a metal silicide region and a conductive contact to the source/drain regions of the device 10. In this example, after the diamond-shaped semiconductor material 19N, 19P are formed, the metal silicide material 28 is formed on the exposed portions of the diamond-shaped fins 19N, 19P. Using this wrap-around technique, the previously described fin merge process is not performed. Thus, the metal silicide material 28, and the conductive contact material (not shown in FIG. 1C) wraps around the exposed portions of the diamond-shaped fins 19N, 190P. FIG. 1C, view "Y-Y" includes a dashed line depicting the upper surface 20S of the sacrificial gate insulation layer 20.

One problem that results from the above process sequence is, at least with a nickel silicide material, the nickel tends to diffuse under the spacers toward the gate. Such diffusion is sometimes referred to in the industry as "silicide pipes." When present, such silicide pipes can be detrimental to device performance as it creates an unwanted conductive path for current to flow. The problem is not as bad when dealing with FinFET devices in which the fins have been merged, as shown in FIG. 1B, because the metal silicide material 28 is spaced relatively far away from the channel region, as reflected by the double arrowed line 30 in FIG. 1B (view Z-Z). However, when the metal silicide regions 28 are formed on the fins of a FinFET device using the wrap-around approach, as shown in FIG. 1C, the metal silicide regions 28 are much closer to the channel region of the device, in the region indicated by the dashed line 32. Thus, the chance of the formation of such silicide pipes is greater when the wrap-around silicide formation process is used as compared to the merged fin/silicide formation process described above. The industry has attempted to combat this problem by using nickel/platinum-based metal silicides, wherein the platinum is present in concentrations of about 1-10%. However, even when used with platinum, the nickel material still has a tendency to diffuse under the spacer, particularly when there is insufficient healing of implant damage or a strain is present due to the silicon nitride spacer contacting silicon.

The present disclosure is directed to methods of forming conductive contacts to the source/drain regions of FinFET devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming conductive contacts to the source/drain regions of FinFET devices. In one example, the method disclosed herein includes forming at least one fin for a FinFET device in a semiconducting substrate, performing at least one process operation to form a region in the fin that contains a metal diffusion inhibiting material, depositing a layer of metal on the region in the at least one fin and forming a metal silicide region on the at least one fin.

Another illustrative method disclosed herein includes forming a shared gate structure above at least one first fin for a first type of FinFET device and above at least one second fin for a second type of FinFET device, wherein the second type is opposite to the first type, performing at least one process operation to form a first region in the first fin and a second region in the second fin, wherein the first and second regions contain a metal diffusion inhibiting material, depositing a layer of metal on the first and second regions and forming metal silicide regions on the first fin and on the second fin.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict various illustrative prior art methods of forming conductive contacts to source/drain regions of an illustrative FinFET device;

FIGS. 2A-2I depict one illustrative method disclosed of forming conductive contacts to the source/drain regions of FinFET devices;

FIGS. 3A-3E depict another illustrative method disclosed of forming conductive contacts to the source/drain regions of FinFET devices; and FIGS. 4A-4E depict yet another illustrative method disclosed of forming conductive contacts to the source/drain regions of FinFET devices.

Figure 1A:
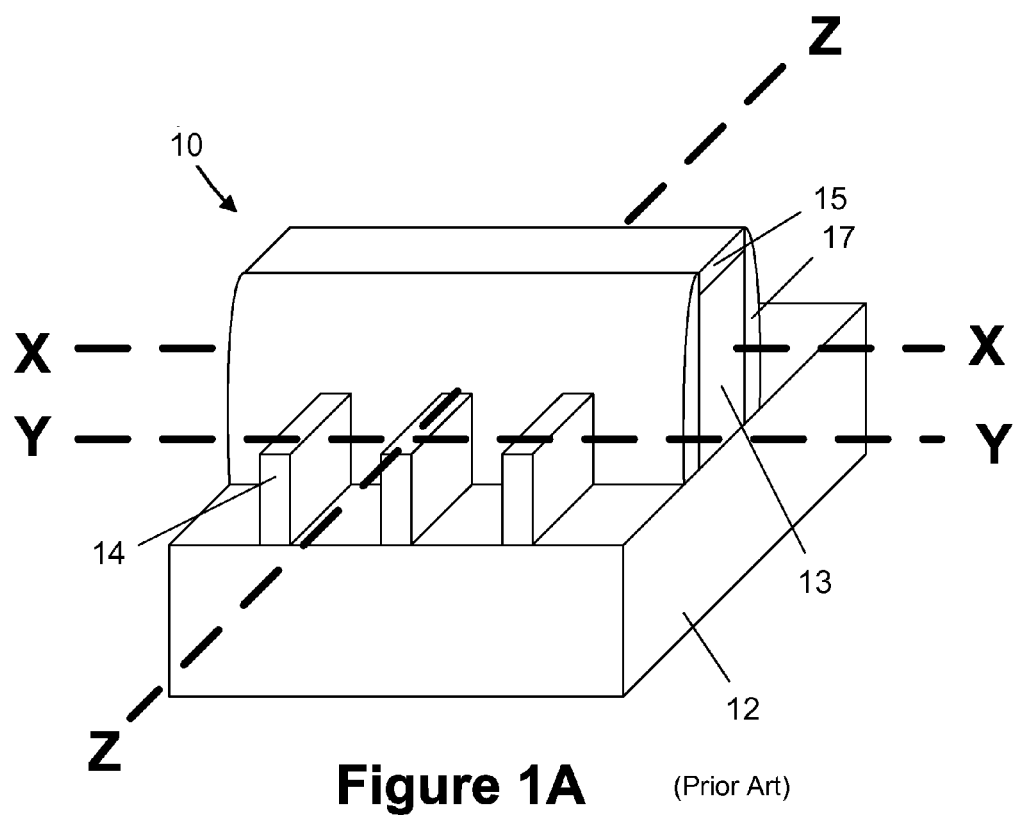

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 2A-2I depict one illustrative embodiment of one illustrative method disclosed herein for forming conductive contacts to the source/drain regions of an illustrative FinFET device 100. The various inventions disclosed herein will be discussed in the context of forming a device 100 that is comprised of opposite type FinFET devices that share a common gate electrode. However, as will be appreciated by those skilled in the art, the present invention should not be considered to be limited to this illustrative configuration. The cross-sectional views shown in the attached figures will be taken where indicated in FIG. 1A, i.e., view "X-X" is a cross-sectional view taken through the gate in the gate width direction, view "Y-Y" is a cross-sectional view taken through the fins in a direction that is transverse to the long axis of the fins, and view "Z-Z" is a cross-sectional view taken along the long axis of one of the fins. It should be understood that FIG. 1A is only provided to show the location of the various cross-sectional views depicted in the drawings below, and many aspects discussed below are not depicted in FIG. 1A so as to not overly complicate the device 10 depicted in FIG. 1A. Moreover, the reference numbers employed below for various structures may not match the reference numbers depicted in FIG. 1A.

FIGS. 2A-2I depict the illustrative situation where an N-type FinFET device will be formed adjacent to a P-type FinFET device, such as in an SRAM structure, and where such devices will ultimately share a common gate structure. However, the method disclosed in FIGS. 2A-2I may be employed on single-type FinFET devices, e.g., N-type FinFET devices or P-type FinFET devices that are spaced apart from one another and do not share a common gate electrode. In general, the methods disclosed in connection with the discussion of FIGS. 2A-2I are directed to techniques of controlling or limiting the diffusion of the metal, e.g., nickel, platinum, etc., used to form metal silicide regions on the source/drain regions of the FinFET device into the silicon-containing fins of the FinFET device.

As shown in FIG. 2A, the N-type FinFET device is separated from the P-type FinFET device by an illustrative shallow trench isolation region 114 that is formed in the substrate 112. Illustrative STI regions 116 are also depicted. The STI region 114 and the STI regions 116 may be formed using traditional techniques. The substrate 112 may have a variety of configurations, such as the depicted bulk substrate configuration or it may have a silicon-on-insulator (SOI) configuration. The substrate 112 may be made of silicon or it may be made of materials other than silicon. Thus, the terms "substrate" or "semiconducting substrate" should be understood to cover all semiconducting materials and all forms of such materials.

In the depicted example, the gate structure for both the N-type FinFET device and the P-type FinFET device will be formed using a so-called "replacement gate" or "gate last" technique. At the point of fabrication depicted in FIG. 2A, a plurality of fins 118N have been formed for the N-type FinFET device and a single fin 118P has been formed for the P-type FinFET device. In one illustrative process flow, an etching process, such as a dry or wet etching process, was performed through a patterned mask layer (not shown) to form a plurality of trenches 113 in the substrate 112 to thereby define the fins 118N, 118P. Of course, as will be appreciated by those skilled in the art after a complete reading of the present application, the FinFET devices may be comprised of any number of fins. The overall size, shape and configuration of the trenches 113 and fins 118N, 118P may vary depending on the particular application. In the illustrative example depicted in the attached drawings, the fins 118N, 118P all have a uniform size and shape. However, as discussed more fully below, such uniformity in the size and shape of the fins 118N, 118P is not required to practice at least some aspects of the inventions disclosed herein. In the example depicted herein, the trenches 113 were formed by performing an anisotropic etching process that results in the trenches 113 having a schematically depicted, generally rectangular configuration. In an actual real-world device, the sidewalls of the trenches 113 may be somewhat inwardly tapered, although that configuration is not depicted in the drawings. Thus, the size and configuration of the trenches 113, and the manner in which they are made, should not be considered a limitation of the present invention. For ease of disclosure, only the substantially rectangular trenches 113 will be depicted in subsequent drawings.

Also depicted in FIG. 2A is a sacrificial gate structure that is comprised of a sacrificial gate insulation layer 120, a sacrificial gate electrode 122 and a gate cap layer 124. However, as noted above, the gate structure depicted in FIG. 2A could also be the final gate structure for the device 100. A layer of sidewall spacer material 126 is also depicted in FIG. 2A. Such layers may be formed using a variety of different materials and by performing a variety of known techniques. For example, the sacrificial gate insulation layer 120 may be comprised of silicon dioxide, the sacrificial gate electrode layer 122 may be comprised of polysilicon or amorphous silicon. The gate cap layer 124 may be comprised of materials such as silicon nitride. The layers of material depicted in FIG. 2A may be formed by any of a variety of different known techniques, e.g., a chemical vapor deposition (CVD) process, an atomic layer deposition (ALD) process, a thermal growth process, etc. The sacrificial gate structure may be formed by patterning the various layers of material that are used in the sacrificial gate structure using traditional photolithography and etching processes. The layer of sidewall spacer material 126 may have a thickness of about 10 nm and it may be comprised of materials such as silicon nitride, silicon oxynitride, silicon nitride carbon, etc.

FIG. 2B depicts the device 100 after an anisotropic etching process operation was performed on the layer of sidewall spacer material 126 to thereby define a first sidewall spacer 126S that extends around the entire perimeter of the sacrificial gate structure. In one embodiment, the etching process operation involves performing an initial "main etch" that is non-selective in nature, and thus faster, to remove most of the thickness of the layer of spacer material 126. At some point, the main etch process is stopped and a selective "over-etch" process is performed to finish the removal of the layer of spacer material 126 and thereby define the first spacer 126S. Importantly, the over-etch process is performed for a sufficient duration such that the fins 118N, 118P are cleared of any spacer material, as shown in FIG. 2B (view Y-Y). The gate cap layer 124 is also etched during the formation of the spacer 126S, but any consumption of the gate cap layer 124 as a result of the spacer etch process is not depicted in the attached drawings. If desired, the first spacer 126S may be formed by performing a single etching process, i.e., by performing only the over-etch portion of the above-described sequence.

FIG. 2C depicts the device 100 after several process operations have been performed. Initially, semiconducting materials 119N, 119P are formed on the fins 118N, 119P, respectively. The semiconducting materials 119N, 119P may be comprised of the same or different semiconducting materials and they may be either doped or undoped, or doped with different dopant materials. In general, the semiconducting materials 119N, 119P are formed by forming a hard mask (not shown), e.g., silicon nitride, over the fins of one of the devices that leaves the fins of the other device exposed, performing an epi pre-clean process (a dilute HF acid cleaning process) on the exposed fin(s) to insure that the exposed fin(s) are clear of all undesirable materials, and then performing an epi deposition process to form a diamond-shaped semiconductor material 119N or 119P on the exposed fins. Thereafter, a very thin protection layer is conformably deposited on the device 100 so as to protect the semiconductor material 119N, 119P, as the case may be. The process is then repeated for the device that was previously masked. Thus, FIG. 2C depicts the formation of the semiconducting materials 119N, 119P and the formation of a protective cap layer 128, e.g., 2-3 nm of silicon nitride, on the device 100 so as to protect the semiconductor materials 119N, 119P.

FIG. 2C also depicts the device 100 after a layer of insulating material 130, e.g., silicon dioxide, is deposited on the device 100 and after a chemical mechanical planarization (CMP) process has been performed to planarize the upper surface of the layer of insulating material 130 with the protective cap layer 128 or the gate cap 124. In one illustrative embodiment, the layer of insulating material 130 may be formed by performing a CVD or ALD process.

FIG. 2D depicts the device 100 after the layer of insulating material 130 has been patterned using traditional photolithography and etching techniques to define openings 130A that exposes the fins 118N, 118P on both sides of the sacrificial gate structure. The etching techniques employed may include reactive ion etching (RIE), atomic layer etching (AMAT, SiCoNi, TEL COR), or a combination of such techniques. The etching process used to etch the opening 130A may be controlled such that the bottom 130B of the opening 130A does not extend all the way to the laterally-oriented portions of the protective layer 128, as depicted in FIG. 2D. Additionally, during the etching process that is performed to form the opening 130A, some of the protective layer 128 surrounding the diamond-shaped fins may be consumed, and portions of the semiconducting material 119N, 119P may be consumed, although such consumption of the protective layer 128 and the semiconducting material 119N, 119P is not depicted in FIG. 2D.

Next, as shown in FIG. 2E, an etching process is performed that removes the material of the protective layer 128 selectively relative to the material of the layer of insulating material 130. At the end of this etching process, substantial portions of the diamond-shaped fins 118N, 118P are exposed for further processing. Note that, although reference is made herein to the formation of the diamond-shaped regions of semiconducting material 119N, 119P, the formation of such additional semiconductor material 119N, 119P is not required to practice at least some aspects of the inventions disclosed herein. For example, if desired, the methods disclosed herein could be performed on the generally rectangular configured fins 118N, 118P shown in FIG. 2A. Thus, when the words "fin" or "fins" is used in the claims, it should be understood to cover any type or shape of fin.

Next, as shown in FIG. 2F, one or more schematically depicted process operations 134 are performed to form regions 134A in the exposed portions of the fins 118N, 118P that contain a metal diffusion inhibiting material. The regions 134A of the metal diffusion inhibiting material is intended to limit or impede the diffusion of metal from the metal silicide regions (not shown in FIG. 2F) that will be formed on the fins 118N, 118P, as described more fully below. In one embodiment, the regions 134A may have a concentration of the metal diffusion inhibiting material of about 0.5-2.5% near the surface of the fins. The process operation 134 may be one or more ion implant processes or one or more plasma doping processes. In one illustrative embodiment, the metal diffusion inhibiting material may be, for example, carbon. In the case where the process operation 134 is an ion implant process, the dopant dose and implant energy used during the implant process may vary depending upon the particular application and the material implanted. In one illustrative example where carbon is used during such an implant process, it may be performed using a dopant dose falling within the range of about $1e^{14}$-$2e^{15}$ ions/cm$^2$ and using an implant energy that falls within the range of about 0.5-5 keV. In one embodiment, this results in the regions 134A having a carbon concentration of about 0.5-2.5% near the surface of the fins. The implant process may be performed at implant angles ranging from 0-45°.

If desired, prior to performing the process operation 134, an amorphization implant process may be performed on the exposed portions of the fins 118N, 119N so as to form amorphous regions in the fins to thereby minimize the potential of channeling of the implanted material, e.g., to limit carbon channeling. Where such an amorphization implant process is performed, it may be performed using, for example, germanium, xenon, silicon, arsenic, etc., using a dopant dose falling within the range of about $5e^{13}$-$1e^{15}$ ions/cm$^2$ and using an implant energy that falls within the range of about 1-10 keV. The dose and energy level selected for the amorphization implant process should be such that the amorphous region is fully consumed during the silicide formation process. Alternatively, an optional heating process can be performed prior to the deposition of the metal layer that will be used to form the metal silicide regions to re-crystallize any unconsumed portions of the amorphous region.

FIG. 2G depicts the device 100 after a layer of refractory metal material 136 has been formed on the device 100 and, more particularly, on the fins 118N, 118P, as part of the process of forming metal silicide regions on the fins 118N, 118P. In one illustrative embodiment, the refractory metal material 136 may be comprised of any metal that may be used to form metal silicide regions on the fins 118N, 118P, e.g., substantially pure nickel, nickel/platinum, platinum, titanium, etc., and it may be formed by performing a physical vapor deposition (PVD) process using the appropriate metal targets. The methods disclosed herein may be particularly useful when the layer of refractory metal material 136 is a metal that has a tendency to diffuse into silicon during the metal silicide formation process, e.g., nickel.

FIG. 2H depicts the device 100 after metal silicide regions 136A have been formed on the fins 118N, 118P by performing traditional metal silicide formation processes. For example, after the layer of refractory metal material 136 is deposited on the fins 118N, 118P, an initial heating process may be performed to cause the refractory metal material 136 to react with underlying silicon-containing fins 118N, 118P, an etching process may be performed to remove unreacted portions of the layer of refractory metal material 136 and an additional heating process may be performed to form the final phase of the metal silicide. The details of such silicidation processes are well known to those skilled in the art.

FIG. 2I depicts the device 100 after a schematically depicted conductive contact structure 140 is formed so as to establish electrical contact to the fins 118N, 118P through the metal silicide regions 136A. The conductive contact structure 140 is intended to be representative in nature, i.e., it is intended to represent any type of conductive material and structures that may be employed to establish electrical connections to the fins 118N, 118P. The conductive contact structure 140 may be comprised of a single layer of conductive material of multiple layers of conductive material. In one illustrative embodiment, the conductive contact structure 140 may be comprised of a first, relatively thin layer of titanium and titanium nitride (not shown) that is conformably deposited across the device 100 and on the fins 118N, 118N and a layer of tungsten (not shown) that is blanket-deposited across the device 100 so as to over-fill the opening 130A. Thereafter, one or more CMP processes may be performed to remove excess portions of the layer of titanium nitride and the layer of tungsten positioned above the surface of the layer of insulating material 130 outside of the opening 130A to thereby result in the contact structure 140.

At the point of fabrication depicted in FIG. 2I, traditional manufacturing techniques may be performed to complete the manufacture of the device 100, e.g., removal of the sacrificial gate structure, formation of a replacement gate structure that contains one or more metal layers, etc. The gate insulation layer of the replacement gate structure of the device 100 may be comprised of a variety of different materials, such as, for example, a so-called high-k (k greater than 10) insulation material (where k is the relative dielectric constant), etc. The gate electrode of the replacement gate structure may also be of one or more conductive materials, such as polysilicon or amorphous silicon, or it may be comprised of one or more metal layers that act as the gate electrode.

FIGS. 3A-3E depict another illustrative method disclosed of forming conductive contacts to the source/drain regions of a FinFET device. FIG. 3A depicts the device 100 at a point of fabrication that corresponds to that described above for FIG. 2E. FIGS. 3A-3E depict the illustrative situation where an N-type FinFET device will be formed adjacent to a P-type FinFET device, such as in an SRAM structure, and where such devices will ultimately share a common gate structure. However, the method disclosed in FIGS. 3A-3E may be employed on single-type FinFET devices, e.g., N-type FinFET devices or P-type FinFET devices that are spaced apart from one another and do not share a common gate electrode.

The methods disclosed in FIGS. 3A-3E may be employed in situations where the same metal may be employed to form a conductive contact to the fins of both an N-type FinFET device and a P-type FinFET device. In general, some contact metals form better contacts, i.e., contacts with a lower Schottky barrier potential to one type of FinFET device as compared to the other type of device. For example, a titanium-based contact material is a good contact metal for forming conductive contacts on an N-type device, but, in a relative sense, a poorer contact metal for forming conductive contacts to a P-type device, i.e., the contact that is formed on a P-type device with a titanium-based material has a greater Schottky barrier potential as compared to the titanium-based contact formed on an N-type device. As another example, a platinum-based contact material is a good contact metal for forming conductive contacts on a P-type device, but, in a relative sense, a poorer contact metal for forming conductive contacts to an N-type device, i.e., the contact that is formed on the N-type device with a platinum-based material has a greater Schottky barrier potential as compared to the platinum-based contact formed on an N-type device.

In general, P-type devices operate in the valence band of silicon while N-type devices operate in the conduction band of silicon. The metals that are conducive to forming good contacts to N-type devices generally have an energy level that is near the conduction band of silicon, and will generally be referred to herein and in the claims as "conduction band metals." Such conduction band metals typically have an energy level that falls within the range of about 0.2 eV. Examples of such conduction band metals include titanium, erbium, yitterbium, yittrium, dysprosium, terbium, etc. Conversely, contact metals that are conducive to forming good contacts to P-type devices generally have an energy level that is near the valence band of silicon, and will generally be referred to herein and in the claims as "valence band metals." Such valence band metals typically have an energy level that falls within the range of about 0.2 eV. Examples of such valence band metals include platinum, iridium, rhenium, nickel, osmium, etc.

FIGS. 3A-3E depict an illustrative example where a conductive contact (in the form of a metal or a metal silicide) is made to the fins of both an N-type and a P-type FinFET device using a valence band metal. FIG. 3B depicts one illustrative embodiment of a method disclosed herein where a patterned mask layer 150, e.g., a patterned photoresist mask, was formed on the device 100 so as to cover the P-type FinFET device and expose the N-type FinFET device for further processing.

Thereafter, one or more schematically depicted process operations 152 are performed to form regions 152A in the exposed portions of the fins 118N that contain a material that is intended to lower the Schottky barrier potential of the contact between the metal silicide region that will be formed on the fins 118N and the semiconductor material of the fins 118N. In one embodiment, the regions 152A may have a concentration of the barrier reducing material of about 0.1-1% near the surface of the fins 118N. In one illustrative embodiment, the barrier reducing material may be, for example, arsenic, phosphorous, antimony, sulfur, tellurium, selenium, nitrogen, etc. The process operation 152 may be one or more ion implant processes or one or more plasma doping processes. In the case where the process operation 152 is an ion implant process, the dopant dose and implant energy used during such an implant process may vary depending upon the particular application and the material implanted. In one illustrative example where arsenic is used during the implant process 152, it may be performed using a dopant dose falling within the range of about $1e^{14}$-$5e^{15}$ ions/cm² and using an implant energy that falls within the range of about 1-3 keV. If desired, the previously described amorphization implant process may be performed prior to implanting the Schottky barrier reducing materials.

FIG. 3C depicts the device 100 after the mask layer 150 has been removed and after a layer of a valence band metal 154 has been formed on the device 100 and, more particularly, on the fins 118N, 118P. In one illustrative embodiment, the layer of valence band metal 154 may be comprised of a platinum-containing material, such as substantially pure platinum, nickel-platinum, rhenium, etc., and it may be formed by performing a PVD process using the appropriate metal targets.

FIG. 3D depicts the device 100 after metal silicide regions 154A comprised of the valence band metal, e.g., platinum, have been formed on the fins 118N, 118P by performing traditional metal silicide formation processes. For example, after the layer of valence band metal 154 is deposited on the fins 118N, 118P, an initial heating process may be performed to cause the layer of valence band metal 154 to react with underlying silicon-containing fins 118N, 118P, an etching process may be performed to remove unreacted portions of the layer of valence band metal 154 and an additional heating process may be performed to form the final phase of the metal silicide regions 154A. The details of such silicidation processes are well known to those skilled in the art.

FIG. 3E depicts the device 100 after a schematically depicted conductive contact structure 160 is formed so as to establish electrical contact to the fins 118N, 118P through the metal silicide regions 154A. As with the previously described conductive contact structure 140, the conductive contact structure 160 is intended to be representative in nature, i.e., it is intended to represent any type of conductive material and structures that may be employed to establish electrical connections to the fins 118N, 118P. The conductive contact structure 160 may be comprised of a single layer of conductive material or multiple layers of conductive material. In one illustrative embodiment, the conductive contact structure 160 may be comprised of a first, relatively thin layer of titanium nitride (not shown) that is conformably deposited across the device 100 and on the fins 118N, 118N and a layer of tungsten (not shown) that is blanket-deposited across the device 100 so as to over-fill the opening 130A.

At the point of fabrication depicted in FIG. 3E, traditional manufacturing techniques, such as those described above, may be performed to complete the manufacture of the device 100, e.g., removal of the sacrificial gate structure, formation of a replacement gate structure that contains one or more metal layers, etc.

FIGS. 4A-4E depict yet another illustrative method disclosed of forming conductive contacts to the source/drain regions of a FinFET device. FIG. 4A depicts the device 100 at a point of fabrication that corresponds to that described above for FIG. 2E. FIGS. 4A-4E depict the illustrative situation where an N-type FinFET device will be formed adjacent to a P-type FinFET device, such as in an SRAM structure, and where such devices will ultimately share a common gate structure. However, the method disclosed in FIGS. 4A-4E may be employed on single-type FinFET devices, e.g., N-type Fin-FET devices or P-type FinFET devices that are spaced apart from one another and do not share a common gate electrode.

FIGS. 4A-4E depict an illustrative example where a conductive contact (in the form of a metal or a metal silicide) is made to the fins of both an N-type and a P-type FinFET device using a conduction band metal. FIG. 4B depicts one illustrative embodiment of a method disclosed herein where a patterned mask layer 162, e.g., a patterned photoresist mask, was formed on the device 100 so as to cover the N-type FinFET device and expose the P-type FinFET device for further processing.

Thereafter, one or more schematically depicted process operations 164 are performed to form regions 164A in the exposed portions of the fin 118P that contain a material that is intended to lower the Schottky barrier potential of the contact between the metal silicide region that will be formed on the fin 118P and the semiconductor material of the fin 118P. In one embodiment, the regions 164A may have a concentration of the barrier reducing material of about 0.1-1.0% near the surface of the fin 118P. In one illustrative embodiment, the barrier reducing material may be, for example, boron, boron difluoride, aluminum, gallium, indium, etc. The process operation 164 may be one or more ion implant processes or one or more plasma doping processes. In the case where the process operation 164 is an ion implant process, the dopant dose and implant energy used during such an implant process may vary depending upon the particular application and the material implanted. In one illustrative example where boron difluoride is used during the implant process, it may be performed using a dopant dose falling within the range of about $1e^{14}$-$5e^{15}$ ions/cm² and using an implant energy that falls within the range of about 1-3 keV. If desired, the previously described amorphization implant process may be performed prior to implanting the Schottky barrier reducing materials.

FIG. 4C depicts the device 100 after the mask layer 162 has been removed and after a layer of a conduction band metal 166 has been formed on the device 100 and, more particularly, on the fins 118N, 118P. In one illustrative embodiment, the layer of conduction band metal 166 may be comprised of a titanium-containing material, such as substantially pure titanium, manganese, titanium-manganese, erbium, yittrium. yitterbium, dysprosium, etc., and it may be formed by performing a PVD process using the appropriate metal targets.

FIG. 4D depicts the device 100 after metal silicide regions 166A comprised of the conduction band metal, e.g., titanium, have been formed on the fins 118N, 118P by performing traditional metal silicide formation processes. For example, after the layer of conduction band metal 166 is deposited on the fins 118N, 118P, an initial heating process may be performed to cause the layer of conduction band metal 166 to react with underlying silicon-containing fins 118N, 118P, an etching process may be performed to remove unreacted portions of the layer of conduction band metal 166 and an additional heating process may be performed to form the final phase of the metal silicide regions 166A. The details of such silicidation processes are well known to those skilled in the art.

FIG. 4E depicts the device 100 after a schematically depicted conductive contact structure 170 is formed so as to establish electrical contact to the fins 118N, 118P through the metal silicide regions 166A. As with the previously described conductive contact structures 140, 160, the conductive contact structure 170 is intended to be representative in nature, i.e., it is intended to represent any type of conductive material and structures that may be employed to establish electrical connections to the fins 118N, 118P. The conductive contact structure 170 may be comprised of a single layer of conductive material or multiple layers of conductive material. In one illustrative embodiment, the conductive contact structure 170 may be comprised of a first, relatively thin layer of titanium nitride (not shown) that is conformably deposited across the device 100 and on the fins 118N, 118P and a layer of tungsten (not shown) that is blanket-deposited across the device 100 so as to over-fill the opening 130A. At the point of fabrication depicted in FIG. 4E, traditional manufacturing techniques, such as those described above, may be performed to complete the manufacture of the device 100, e.g., removal of the sacrificial gate structure, formation of a replacement gate structure that contains one or more metal layers, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming at least one fin for a FinFET device in a semiconducting substrate;
   performing an amorphization implant process on said at least one fin to form an amorphous region in said at least one fin;
   performing at least one process operation to form a diffusion inhibiting region in said amorphous region that contains a metal diffusion inhibiting material;
   depositing a layer of metal on said amorphous region including said diffusion inhibiting region; and
   forming a metal silicide region on said at least one fin using said layer of metal.

2. The method of claim 1, wherein said FinFET device is an N-type FinFET device.

3. The method of claim 1, wherein said FinFET device is a P-type FinFET device.

4. The method of claim 1, wherein performing said at least one process operation comprises performing at least one ion implant process.

5. The method of claim 1, wherein performing said at least one process operation comprises performing at least one plasma doping process.

6. The method of claim 1, wherein said metal diffusion inhibiting material is comprised of carbon.

7. The method of claim 1, wherein performing said at least one process operation comprises performing an ion implant process using a dopant dose falling within the range of about $1e^{14}$-$2e^{15}$ ions/cm$^2$ and using an implant energy that falls within the range of about 0.5-5 keV.

8. The method of claim 1, wherein said amorphization implant process is performed using one of germanium, xenon, silicon or arsenic.

9. The method of claim 8, wherein said amorphization implant process is performed using a dopant dose falling within the range of about $5e^{13}$-$1e^{15}$ ions/cm$^2$ and using an implant energy that falls within the range of about 1-10 keV.

10. The method of claim 1, wherein said at least one fin has one of a generally rectangular configuration or a diamond-shaped configuration.

11. The method of claim 1, wherein, prior to performing said at least one process operation, the method further comprises:
    conformably depositing a protective layer on said at least one fin;
    forming a layer of insulating material above said protective layer;
    forming an opening in said layer of insulating material that exposes said protective layer; and
    performing an etching process to remove at least portions of said protective layer so as to thereby expose at least a portion of said at least one fin.

12. A method, comprising:
    forming a shared gate structure above at least one first fin for a first type of FinFET device and above at least one second fin for a second type of FinFET device, said second type being opposite to said first type;
    performing an amorphization implant process on said at least one first fin and said at least one second fin to form an amorphous region in each of said at least one first fin and said at least one second fin
    performing at least one process operation to form a first diffusion inhibiting region in said amorphous region of said at least one first fin and a second diffusion inhibiting region in said amorphous region of said at least one second fin, wherein said first and second diffusion inhibiting regions contain a metal diffusion inhibiting material;
    depositing a layer of metal on said amorphous regions including said first and second diffusion blocking regions; and
    forming metal silicide regions on said at least one first fin and on said at least one second fin.

13. The method of claim 12, wherein said first FinFET device is an N-type FinFET device and said second FinFET device is a P-type FinFET device.

14. The method of claim 12, wherein said first FinFET device is a P-type FinFET device and said second FinFET device is an N-type FinFET device.

15. The method of claim 12, wherein performing said at least one process operation comprises performing at least one ion implant process.

16. The method of claim 12, wherein performing said at least one process operation comprises performing at least one plasma doping process.

17. The method of claim 12, wherein said metal diffusion inhibiting material is comprised of carbon.

18. The method of claim 12, wherein performing said at least one process operation comprises performing an ion implant process using a dopant dose falling within the range of about $1e^{14}$-$2e^{15}$ ions/cm$^2$ and using an implant energy that falls within the range of about 0.5-5 keV.

19. The method of claim 12, wherein said amorphization implant process is performed using one of germanium, xenon, silicon or arsenic.

20. The method of claim 19, wherein said amorphization implant process is performed using a dopant dose falling within the range of about $5e^{13}$-$1e^{15}$ ions/cm$^2$ and using an implant energy that falls within the range of about 1-10 keV.

21. The method of claim 12, wherein said shared gate structure is a sacrificial gate structure.

22. The method of claim 12, wherein, prior to performing said at least one process operation, the method further comprises:
    conformably depositing a protective layer on said at least one first fin and said at least one second fin;
    forming a layer of insulating material above said protective layer;
    forming an opening in said layer of insulating material that exposes said protective layer; and
    performing an etching process to remove at least portions of said protective layer so as to thereby expose at least a portion of said at least one first fin and at least a portion of said at least one second fin.

23. A method, comprising:

forming at least one fin for a FinFET device in a semiconducting substrate;

performing an amorphization implant process using a first implantation species on said at least one fin to form an amorphous region in said at least one fin;

performing at least one implantation process using a second implantation species different from said first implantation species to form a diffusion inhibiting region in said amorphous region that contains a metal diffusion inhibiting material comprising said second implantation species;

depositing a layer of metal on said amorphous region including said diffusion inhibiting region; and forming a metal silicide region on said at least one fin using said layer of metal.

24. The method of claim 23, wherein said second implantation species comprises carbon.

* * * * *